US007542326B2

(12) United States Patent
Yoshimura et al.

(10) Patent No.: US 7,542,326 B2
(45) Date of Patent: Jun. 2, 2009

(54) SEMICONDUCTOR MEMORY DEVICE

(75) Inventors: Satoshi Yoshimura, Kameyama (JP); Shinichi Sato, Fukuyama (JP); Satoru Yamagata, Fukuyama (JP); Shinji Horii, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 64 days.

(21) Appl. No.: 11/889,388

(22) Filed: Aug. 13, 2007

(65) Prior Publication Data

US 2008/0049487 A1 Feb. 28, 2008

(30) Foreign Application Priority Data

Aug. 22, 2006 (JP) ............................ 2006-225811

(51) Int. Cl.
*G11C 11/00* (2006.01)

(52) U.S. Cl. ....................... 365/148; 365/171; 365/173; 365/158

(58) Field of Classification Search ................. 365/148, 365/171, 173, 158
See application file for complete search history.

(56) References Cited

U.S. PATENT DOCUMENTS

| | | | | |
|---|---|---|---|---|
| 5,436,913 | A * | 7/1995 | Yamamura et al. | 714/719 |
| 5,714,400 | A * | 2/1998 | Hirao et al. | 438/238 |
| 6,740,921 | B2 * | 5/2004 | Matsuoka et al. | 257/302 |
| 6,822,897 | B2 * | 11/2004 | Ishikawa | 365/171 |
| 6,826,076 | B2 * | 11/2004 | Asano et al. | 365/158 |
| 6,873,561 | B2 * | 3/2005 | Ooishi | 365/226 |
| 6,888,745 | B2 * | 5/2005 | Ehiro et al. | 365/158 |
| 6,985,376 | B2 * | 1/2006 | Matsuoka | 365/148 |
| 6,995,999 | B2 * | 2/2006 | Morimoto | 365/148 |
| 6,998,698 | B2 * | 2/2006 | Inoue et al. | 257/539 |
| 7,057,922 | B2 * | 6/2006 | Fukumoto | 365/158 |
| 7,184,295 | B2 * | 2/2007 | Tsushima et al. | 365/148 |
| 7,187,576 | B2 * | 3/2007 | Braun et al. | 365/158 |

(Continued)

FOREIGN PATENT DOCUMENTS

| | | |
|---|---|---|
| JP | 2004-87069 | 3/2004 |

(Continued)

OTHER PUBLICATIONS

Zhuang et al. (Dec. 2002). "Novell Colossal Magnetoresistive Thin Film Nonvolatile Resistance Random Access Memory (RRAM)," IEDM Report No. 7.5.

*Primary Examiner*—Viet Q Nguyen
(74) *Attorney, Agent, or Firm*—Morrison & Foerster LLP

(57) ABSTRACT

A semiconductor memory device comprises an array of memory cells each comprising a variable resistance element and a cell access transistor, and a voltage supplying means for applying the first voltage between the bit and source lines connected to the selected memory cell, the third voltage to the word line to apply the first write voltage between the two ports of the variable resistance element for shifting the resistance from the first state to the second state, and the second voltage opposite in polarity to the first voltage between the bit and source lines, the third voltage to the word line to apply the second write voltage opposite in polarity to and different in the absolute value from the first write voltage between the two ports for shifting the resistance from the second state to the first state, the voltage supplying means comprising an n-channel MOSFET and a p-channel MOSFET.

27 Claims, 16 Drawing Sheets

U.S. PATENT DOCUMENTS

| | | | | |
|---|---|---|---|---|
| 7,286,394 | B2 * | 10/2007 | Ooishi | 365/158 |
| 7,324,366 | B2 * | 1/2008 | Bednorz et al. | 365/148 |
| 7,394,685 | B2 * | 7/2008 | Ooishi et al. | 365/171 |
| 2004/0095805 | A1 | 5/2004 | Matsuoka | |
| 2004/0130939 | A1 | 7/2004 | Morikawa | |
| 2004/0264244 | A1 | 12/2004 | Morimoto | |
| 2005/0122768 | A1 | 6/2005 | Fukumoto | |

FOREIGN PATENT DOCUMENTS

| | | |
|---|---|---|
| JP | 2004-158119 | 6/2004 |
| JP | 2004-185755 | 7/2004 |
| JP | 2004-185756 | 7/2004 |
| JP | 2004-355670 | 12/2004 |
| JP | 2005-025914 | 1/2005 |
| JP | 2005-92912 | 4/2005 |

* cited by examiner

SEMICONDUCTOR MEMORY DEVICE

CROSS REFERENCE TO RELATED APPLICATION

This Nonprovisional application claims priority under 35 U.S.C. §119(a) on Patent Application No. 2006-225811 filed in Japan on Aug. 22, 2006 the entire contents of which are hereby incorporated by reference.

BACKGROUND OF THE INVENTION

1. Field of the Invention

The present invention relates to a semiconductor memory device arranged in which each memory cell comprises a variable resistance element having two-port structure for storing information by varying its electrical resistance between a first state and a second state when receiving different polarity voltages at the two ports respectively and a cell access transistor connected at the drain to one port of the variable resistance element and more particularly to an action of writing the memory state of the memory cell.

2. Description of the Related Art

Recently, there have been increased a number of occasions for using cash cards, credit cards, prepaid cards in common livings. Conventionally, most of such cards are implemented by magnetic cards for storing information. As personal information has to be handled with much care, the magnetic cards are now being replaced by IC cards which are much easier to take security measures.

Such IC cards preferably employ nonvolatile semiconductor memory devices where the information is saved and not deleted when being disconnected from power sources. Nonvolatile semiconductor memory devices include typically flash memories and FeRAMs. Those types however have trade-off relationship between the high speed operation during the writing action, the power consumption, and the durability to the writing action. Accordingly, various studies have been attempted for satisfying two or more of the requirements in the nonvolatile semiconductor memory devices. One of the mostly feasible studies proposes a variable resistance type of nonvolatile semiconductor memory device where a variable resistance type nonvolatile memory cell is provided for varying its electrical resistance when receiving an electric stress such as application of voltage and holding its resistance state at a nonvolatile mode. This type of nonvolatile semiconductor memory device is highly prospective as improved in the high speed operation, the low power consumption, and the mass storage size.

The variable resistance element in such a variable resistance type nonvolatile semiconductor memory device may commonly be a made by a manganese-containing oxide material having a perovskite crystalline structure, such as $Pr_{1-x}Ca_xMnO_3$ (where 0<x<1, referred to as PCMO hereinafter) which has properties of colossal magnetoresistance (CMR) and high temperature superconductivity (HTSC) (See "Novel colossal magnetoresistive thin film nonvolatile resistance random access memory (RRAM)" by Zhuang H. H. et al, IEDM Report No. 7.5, December 2002). The manganese-containing oxide material is varied in the resistance value when receiving pulses of voltage. As its resistance value is related to information, the material can be used as a memory element in the semiconductor memory device.

FIG. 14 illustrates a profile of the switching characteristic of the electrical resistance of PCMO disclosed in the above described citation. The switching characteristic graphically shown in FIG. 14 is a change of the resistance value in the case when the pulses of ±5 V for 100 ns are applied to the PCMO having a thickness of 100 nm alternatively, where the vertical axis indicates a resistance value and the horizontal axis indicates the number of pulse application. When receiving the pluses of voltage which are different in the polarity, the PCMO is varied in the resistance value ranging from 1 kΩ to 1 MΩ. Since its resistance value is varied within a range as wide as three digits, the PCMO can favorably be used as a variable resistance element in the nonvolatile semiconductor memory device.

More particularly for being practically utilized in the form of a memory cell in the variable resistance type nonvolatile semiconductor memory device, the above described variable resistance element is accompanied with a cell access transistor to form a 1T1R (one transistor and one resistance element) construction (as disclosed in, for example, Japanese Unexamined Patent Publications No. 2005-25914, No. 2004-185755, and No. 2004-158119). One memory cell of the 1T1R construction is shown in FIG. 15 where the variable resistance element having two-port structure is connected at one port to either the drain or the source of a cell access transistor to form a series circuit. The cell access transistor may preferably be an n-channel MOSFET in consideration with the layout area size or the like.

FIG. 16 illustrates an example of an array of the 1T1R type memory cells shown in FIG. 15 and arranged in rows (along the vertical direction in FIG. 16) and columns (along the horizontal direction in FIG. 16). The cell access transistors in the memory cells aligned along one row are connected at the gate to a common word line extending along the row. Similarly, the cell access transistors in the memory cells aligned along one column are connected at the drain to a common bit line extending along the column. The other port of the variable resistance element in each memory cell is connected to a source line which extends along the row or column (as denoted by the grounding mark for each memory cell in FIG. 16). The source lines may be provided along their respective rows or columns or connected as common lines to the memory cell arrays or in any other applicable fashion. In general, the source lines are connected via the n-channel MOSFETs to the ground as disclosed in Japanese Unexamined Patent Publication No. 2004-158119.

Using the 1T1R type of the memory cell or memory cell array in the variable resistance type nonvolatile semiconductor memory device, as shown in FIGS. 15 and 16, the variable resistance element in the memory cell has to be supplied with a positive voltage from the bit line via the cell access transistor in the memory cell when a program or erase voltage is applied between the two ports of the variable resistance element in order to increase or decrease its electrical resistance. When the cell access transistor is supplied with the positive voltage at both the drain and the gate, a voltage drop equal to the amplitude of the threshold voltage assigned to the cell access transistor will occur at the source of the cell access transistor. It is hence necessary for supplying between the two ports of the variable resistance element with the voltage at a sufficient amplitude to boost the positive voltage before being applied to the drain or gate of the cell access transistor by an increase which can offset the drop in the voltage equal to the threshold voltage. This requires a boosting circuit to be added, thus increasing the tip size and thus the production cost of the semiconductor memory device.

Also, since the variable resistance elements in the memory cells in the memory cell array shown in FIG. 16 are directly connected with the source lines, they may be supplied with the positive voltage directly from the source lines. However in most cases, the voltage of the source lines is set with the n-channel MOSFETs of which the threshold voltage in turn causes a voltage drop. Accordingly, when the variable resistance element is supplied with the voltage at both, positive and negative, polarities between its two ports for conducting the erasing or programming action, a voltage drop equal to the threshold voltage will be inevitable.

SUMMARY OF THE INVENTION

The present invention has been developed in view of the above aspects and its object is to provide a semiconductor memory device arranged in which, for subjecting its memory cell composed of a variable resistance element and a cell access transistor to the writing action, the effect of a drop in the positive voltage to be applied from the source line to the variable resistance element which is equivalent to an amplitude of the threshold voltage is offset so that at least one of two polarities of the voltage applied between the two ports of the variable resistance element remains not effected from the drop in the voltage.

For achievement of the above object, a semiconductor memory device according to the present invention is provided as a first feature comprising: an array of memory cells arranged in a row direction and a column direction, each memory cell including a series circuit of a variable resistance element having two-port structure and a cell access transistor of enhancement type n-channel MOSFET connected at the drain to the second port of the variable resistance element, and specified in which the cell access transistors in the memory cells aligned along one row are connected at the gate to a common word line extending in the row direction, the variable resistance elements in the memory cells aligned along one column are connected at the first port to a common bit line extending in the column direction, and the cell access transistor in each memory cell is connected at the source to a source line extending in the row or column direction; and a voltage supplying means arranged for conducting a first writing action for shifting an electrical resistance from a first state to a second state by applying a first voltage between the bit line and the source line connected to a selected memory cell to be written in the memory cell array and a third voltage to the word line connected to the gate of the cell access transistor in the selected memory cell thus to apply a first write voltage between the two ports of the variable resistance element in the selected memory cell, and for conducting a second writing action for shifting the electrical resistance from the second state to the first state by applying a second voltage, which is opposite in the polarity to the first voltage, between the bit line and the source line connected to the selected memory cell and the third voltage to the word line connected to the gate of the cell access transistor in the selected memory cell thus to apply a second write voltage between the two ports of the variable resistance element in the selected memory cell, the second write voltage being opposite in the polarity to and different in the absolute value from the first write voltage. In particular, the variable resistance element is a nonvolatile memory device for, when receiving the first write voltage and the second write voltage at the two ports respectively, shifting the electrical resistance between the first state and the second state thus to electrically program or erase information. Also, the voltage supplying means comprises an enhancement type n-channel MOSFET and an enhancement type p-channel MOSFET as drive elements for driving the source line.

Further, a semiconductor memory device according to the present invention is provided as a second feature comprising: an array of memory cells arranged in a row direction and a column direction, each memory cell including a series circuit of a variable resistance element having two-port structure and a cell access transistor of enhancement type n-channel MOSFET connected at the source to the second port of the variable resistance element, and specified in which the cell access transistors in the memory cells aligned along one row are connected at the gate to a common word line extending in the row direction, the cell access transistors in the memory cells aligned along one column are connected at the drain to a common bit line extending in the column direction, and the variable resistance element in each memory cell is connected at the first port to a source line extending in the row or column direction; and a voltage supplying means arranged for conducting the first writing action for shifting the electrical resistance from a first state to a second state by applying a first voltage between the bit line and the source line connected to a selected memory cell to be written in the memory cell array and a third voltage to the word line connected to the gate of the cell access transistor in the selected memory cell thus to apply a first write voltage between the two ports of the variable resistance element in the selected memory cell, and for conducting the second writing action for shifting the electrical resistance from the second state to the first state by applying a second voltage, which is opposite in the polarity to the first voltage, between the bit line and the source line connected to the selected memory cell and the third voltage to the word line connected to the gate of the cell access transistor in the selected memory cell thus to apply a second write voltage between the two ports of the variable resistance element in the selected memory cell, the second write voltage being opposite in the polarity to and different in the absolute value from the first write voltage. In particular, the variable resistance element is a nonvolatile memory device for, when receiving the first write voltage and the second write voltage at the two ports respectively, shifting the electrical resistance between the first state and the second state thus to electrically program or erase information. Also, the voltage supplying means comprises an enhancement type n-channel MOSFET and an enhancement type p-channel MOSFET as driver elements for driving the source line.

While the MOSFET is commonly arranged with its drain implemented by one of two impurity diffusion areas which sandwich the gate and the source by the other, the drain and the source may be determined from the two impurity diffusion areas depending on the circuitry arrangement. The cell access transistor of n-channel MOSFET in the device according to the present invention permits the area closer to the bit line to be determined as the drain and the other area closer to the source line to be determined as the source for ease of the description. Even when the drain and the source are determined in the reverse manner, the teaching of the invention remains unchanged.

The semiconductor memory device of the first feature allows the cell access transistor in each memory cell to be connected at the source line side, whereby, in either the first and second writing actions corresponding to the first voltage or the second voltage applied between the bit line and the source line connected to the selected memory cell, whichever is higher at the source line side, the upper limit of the voltage to be applied to the second port of the variable resistance element can stay not exceeding a level determined by subtracting an amplitude of the threshold voltage from the third voltage applied to the word line, hence making the voltage between the two ports of the variable resistance element lower than the voltage between the bit line and the source line. On the other hand, in either the first or second writing action corresponding to the first voltage or the second voltage applied between the bit line and the source line connected to the selected memory cell, whichever is higher at the bit line side, the lower limit of the voltage to be applied to the second port of the variable resistance element is not affected by any drop in the voltage caused by the threshold voltage in the cell access transistor but is equal to the voltage of the source line at the lower voltage side, hence permitting the variable resistance element to receive between the two ports the voltage applied between the bit line and the source line. Also, since the drivers for driving the source lines are implemented by the enhancement type n-channel MOSFET and the enhancement type p-channel MOSFET, the first or second voltage whichever is higher at the source line side is applied from the p-channel MOSFET to the source line, thus permitting the voltage received by the voltage supplying means to remain not affected by any drop due to the threshold voltage in the n-channel MOSFT.

The semiconductor memory device of the second feature allows the cell access transistor in each memory cell to be connected at the bit line side, whereby, in either the first and second writing actions corresponding to the first voltage or the second voltage applied between the bit line and the source line connected to the selected memory cell, whichever is higher at the bit line side, the upper limit of the voltage to be applied to the second port of the variable resistance element can stay not exceeding a level determined by subtracting an amplitude of the threshold voltage from the third voltage applied to the word line, hence making the voltage between the two ports of the variable resistance element lower than the voltage between the bit line and the source line. On the other hand, in either the first or second writing action corresponding to the first voltage or the second voltage applied between the bit line and the source line connected to the selected memory cell, whichever is higher at the bit line side, the lower limit of the voltage to be applied to the second port of the variable resistance element is not affected by any drop in the voltage caused by the threshold voltage in the cell access transistor but is equal to the voltage of the source line at the lower voltage side, hence permitting the variable resistance element to receive between the two ports the voltage applied between the bit line and the source line. Also, since the drivers for driving the source lines are implemented by the enhancement type n-channel MOSFET and the enhancement type p-channel MOSFET, the first or second voltage whichever is higher at the source line side is applied from the p-channel MOSFET to the source line, thus permitting the voltage received by the voltage supplying means to remain not affected by any drop due to the threshold voltage in the n-channel MOSFET.

Moreover, the semiconductor memory device of the first or second feature allows the first write voltage and the second write voltage applied between the two ports of the variable resistance element to be different from each other in the absolute value in both the first writing action and the second writing actions. When the write voltage is selected which is smaller in the absolute value in the writing action where the voltage is higher at the source line side, the absolute value of the first or second write voltage remains low to be applied between the bit line and the source line connected to the selected memory cell, thus lowering the voltage level for conducting the first or second writing action. This requires no step of boosting the voltage during the action, hence minimizing the tip area and the power consumption without unwanted boosting actions.

The semiconductor memory device of the first or second feature may be modified where the n-channel MOSFET of the cell access transistor is replaced by an electrically openable and closable switch arranged responsive to a voltage received at the control terminal for shifting the conductivity from the conductive state to the non-conductive state or vice versa between the first switching terminal and the second switching terminal. This will also ease the effect of a voltage drop triggered by the switching action at the conductive state.

As a third feature in addition to the first feature and the second feature, the semiconductor memory device according to the present invention may further comprise a readout circuit for detecting a current flowing the bit line connected to the selected memory cell to be read out in the memory cell array and reading the memory state from the selected memory cell, wherein in the reading action for reading the memory state from the selected memory cell, the voltage supplying means applies a fourth voltage between the bit line and the source line connected to the selected memory cell and then a fifth voltage to the word line connected to the gate of the cell access transistor in the selected memory cell for turning the cell access transistor on and the readout circuit detects a memory cell current which flows from the bit line to the source line connected to the selected memory cell through the variable resistance element and the cell access transistor in the selected memory cell according to the electrical resistance of the variable resistance element thus to read the memory state from the memory cell.

The semiconductor memory device of the third feature allows the n-channel MOSFET of the cell access transistor to be replaced by the electrically openable and closable switch for shifting the conductivity from the conductive state to the non-conductive state or vice versa between the first switching terminal and the second switching terminal when receiving a voltage input at the control terminal. In this case, the control terminal of the switch corresponds to the gate of the cell access transistor and the switch can be shifted to the conductive state when the fifth voltage is applied to the word line.

According to the semiconductor memory device of the third feature, the information stored in the memory cell through the first or second writing action can be read out for each memory cell.

The semiconductor memory device according to the present invention may further be modified as a fourth feature in addition to the third feature, wherein the fifth voltage and the third voltage are identical to each other.

According to the semiconductor memory device of the fourth feature, the voltage applied to the word line connected to the gate of the cell access transistor in the selected memory cell can be shared by the first writing action and the second writing action. As the result, a voltage generator circuit will be provided for common use. Also, as the peripheral circuit is simplified in the arrangement, the overall tip area will further be minimized.

The semiconductor memory device according to the present invention may further be modified as a fifth feature in addition to any of the foregoing features, wherein the voltage supplying means uses the n-channel MOSFET or the p-channel MOSFET as the drive element by switching them between on and off according to whether it is in the first writing action and the second writing action.

According to the semiconductor memory device of the fifth feature, when the p-channel MOSFET is turned on, the voltage can be applied from the voltage supplying means to the source line directly with no drop in the voltage caused by the threshold voltage in the n-channel MOSFET in either the first or second writing action corresponding to the first voltage or the second voltage applied between the bit line and the source line connected to the selected memory cell, whichever is higher at the source line side. Also, when the n-channel MOSFET is turned on, the voltage can be applied from the voltage supplying means to the source line directly with no drop in the voltage caused by the threshold voltage in the n-channel MOSFET in either the first or second writing action corresponding to the first voltage or the second voltage applied between the bit line and the source line connected to the selected memory cell, whichever is lower at the source line side.

The semiconductor memory device according to the present invention may further be modified as a sixth feature in addition to any of the foregoing features, wherein the first voltage and the second voltage are equal to each other in the absolute value.

According to the semiconductor memory device of the sixth feature, the first voltage for the first writing action can be used, for example, as the second voltage for the second writing action when having been inverted in the polarity because its absolute value is equal to that of the second voltage. As the first voltage and the second voltage need not to be generated separately, one voltage generator circuit can be shared by the first voltage and the second voltage. Also, as the peripheral circuit is simplified in the arrangement, the overall tip area will further be minimized.

Since the first voltage and the second voltage are equal in the absolute value and the first write voltage and the second write voltage applied between the two ports of the variable resistance element are different in the absolute value, a difference in the absolute value between the first write voltage and the second write voltage can be offset by a voltage drop due to the threshold voltage in the cell access transistor. This action may be carried out by controlling either the threshold voltage or the gate voltage.

The semiconductor memory device according to the present invention may further be modified as a seventh feature in addition to any of the foregoing features, wherein the potential at the high voltage side applied between the bit line and the source line connected to the selected memory cell is equal to the potential at the word line connected to the selected memory cell in at least either the first write action or the second write action.

According to the semiconductor memory device of the seventh feature, in at least either the first or second writing action, the potential at the high voltage side applied between the bit line and the source line connected to the selected memory cell and the potential at the word line connected to the selected memory cell are equal for common use and one voltage generator circuit can be shared by the two potentials. Also, as the peripheral circuit is simplified in the arrangement, the overall tip area will further be minimized.

The semiconductor memory device according to the present invention may further be modified as an eighth feature in addition to any of the first to sixth features, wherein the potential at the word line connected to the selected memory cell is higher than the potential at the high voltage side applied between the bit line and the source line connected to the selected memory cell in at least either the first writing action or the second writing action.

According to the semiconductor memory device of the eighth feature, the first voltage and the second voltage can be held equal to each other in the absolute value by controlling the potential at the word line thus to determine a desired difference in the absolute value between the first write voltage and the second write voltage. More specifically, the threshold voltage in the cell access transistor can be set equal to that in the n-channel MOSFET of the peripheral circuit.

The semiconductor memory device according to the present invention may further be modified as a ninth feature in addition to any of the foregoing features, wherein the potential at the low voltage side applied between the bit line and the source line connected to the selected memory cell is equal to the grounding potential in at least either the first writing action or the second writing action.

According to the semiconductor memory device of the ninth feature, the potential at the low voltage side applied between the bit line and the source line connected to the selected memory cell and the grounding voltage are equal to each other for common use and a voltage generator circuit at the low potential side can be eliminated. As the peripheral circuit is simplified in the arrangement, the overall tip area will further be minimized.

The semiconductor memory device according to the present invention may further be modified as a tenth feature in addition to any of the foregoing features, wherein the potential at the high voltage side applied between the bit line and the source line connected to the selected memory cell is equal between the first writing action and the second writing action.

According to the semiconductor memory device of the tenth feature, the potential at the high voltage side applied between the bit line and the source line connected to the selected memory cell is equal between the two writing actions and one voltage generator circuit can be shared by the two actions. Also, as the peripheral circuit is simplified in the arrangement, the overall tip area will further be minimized.

The semiconductor memory device according to the present invention may further be modified as an eleventh feature in addition to any of the foregoing features, wherein the first and second states of the electrical resistance in the variable resistance element are two of three or more resistance states which correspond to the memory states of the variable resistance element, the action of shifting the resistance state to other state than the first and second states is carried out by controlling the voltage level or the application time of the first voltage in the first writing action or the second voltage in the second writing action.

According to the semiconductor memory device of the eleventh feature, the information stored in the memory cell can be multi-leveled, hence allowing the storage size to be increased without depending on the miniaturization of the memory cell.

The semiconductor memory device according to the present invention may further be modified as a twelfth feature in addition to any of the foregoing features, wherein the variable resistance element comprises a variable resistor which contains titanium nitride, titanium oxide, or titanium oxynitride.

The semiconductor memory device according to the present invention may further be modified as a thirteenth feature in addition to any of the first to eleventh features, wherein the variable resistance element comprises a variable resistor which contains a manganese-containing oxide having perovskite structure expressed by $Pr_{(1-x)}Ca_xMnO_3$ (where $0<x<1$).

According to the semiconductor memory device of the twelfth or thirteenth feature, the variable resistance element has an attribute that one of the two write voltages to be applied between the two ports of the variable resistance element for conducting the first writing action and the second writing action is different in both the polarity and the absolute value from the other, thus contributing to the effective performance of the semiconductor memory device.

DETAILED DESCRIPTION OF THE INVENTION

Some embodiments of a semiconductor memory device according to the present invention (referred to as an inventive device hereinafter) will be described referring to the relevant drawings.

FIRST EMBODIMENT

Figure 1:
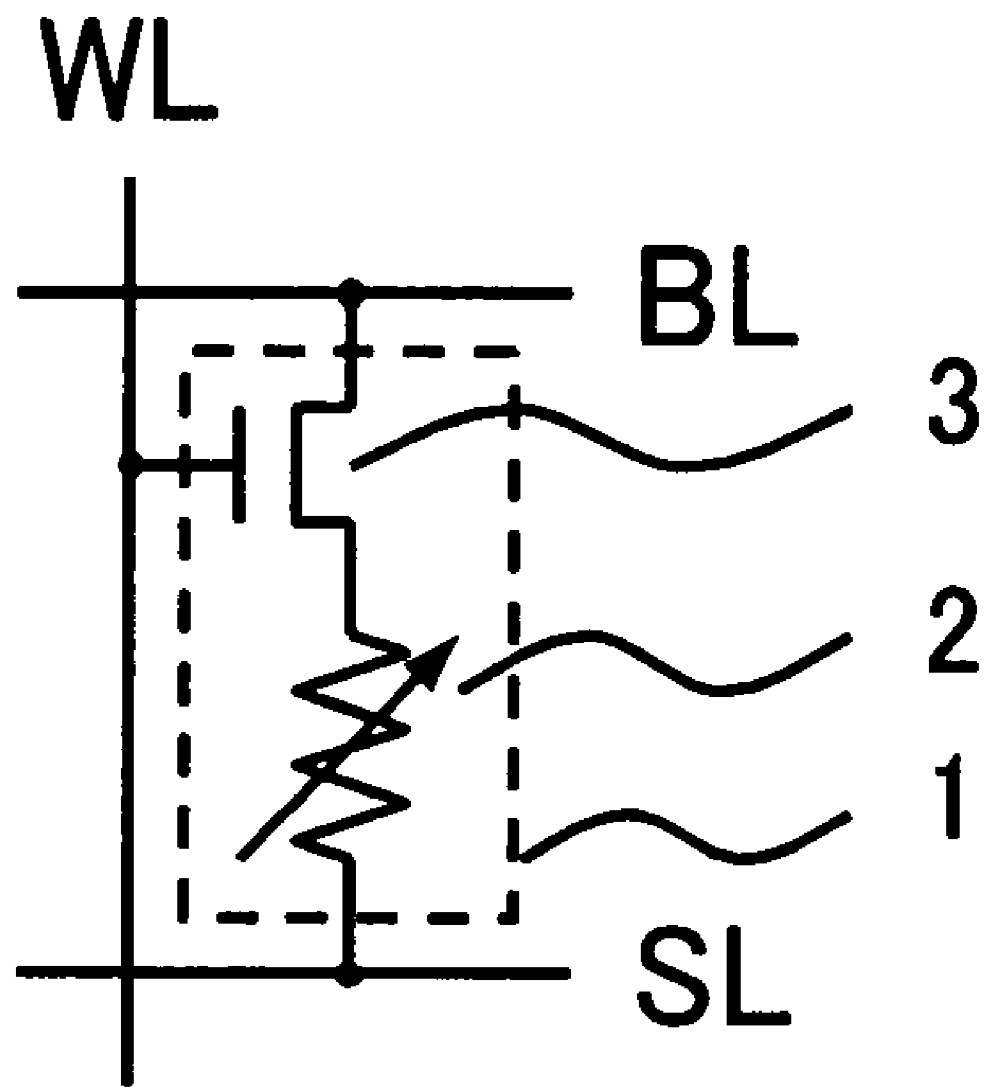
FIG. 1 is a circuitry diagram schematically showing an arrangement of a memory cell in a semiconductor memory device according to the first to fourth embodiments of the present invention.
Figure 15:
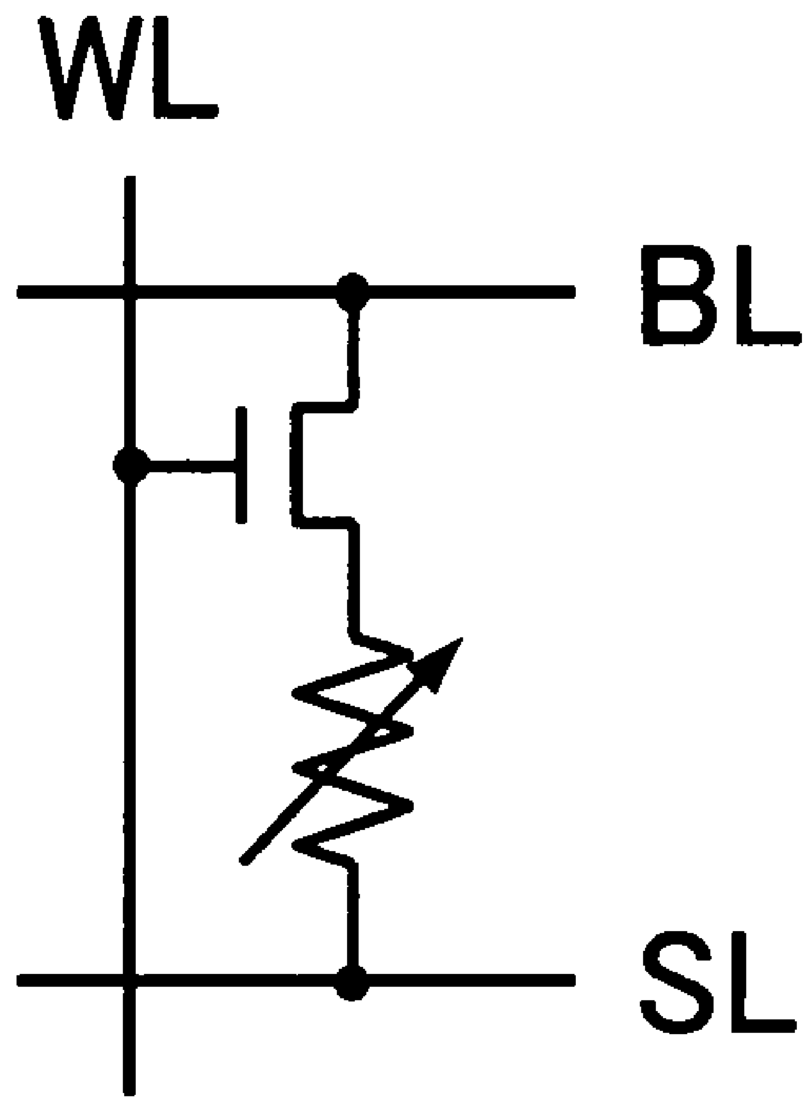
FIG. 15 is a circuitry diagram schematically showing an arrangement of an 1T1R type memory cell.
Figure 16:
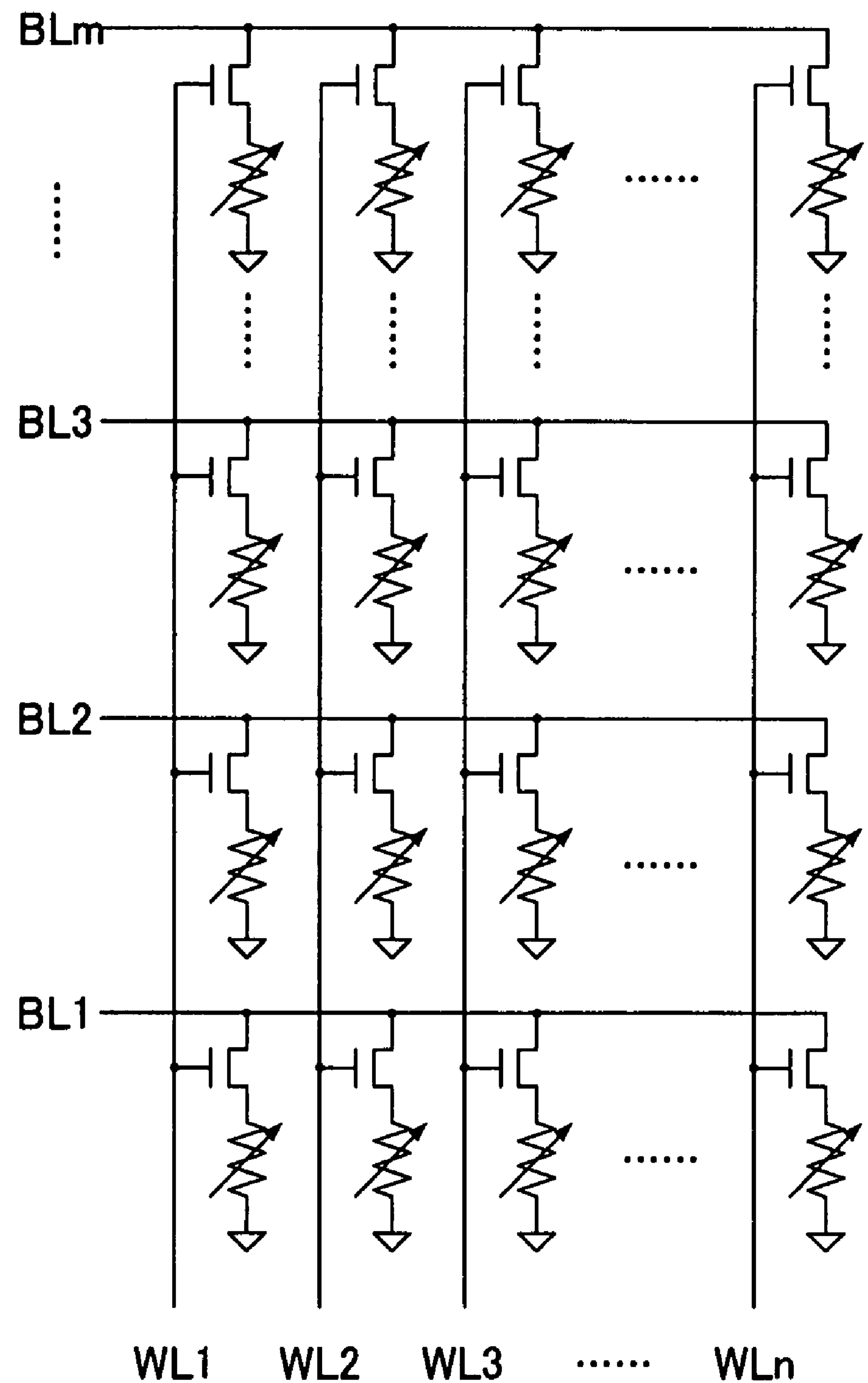
FIG. 16 is a circuitry diagram schematically showing an arrangement of an array of the 1T1R type memory cells shown in FIG. 15.

FIG. 1 schematically illustrates an arrangement of a memory cell provided in the inventive device of the first embodiment. As shown in FIG. 1, the memory cell 1 is of 1T1R type where a variable resistance element 2 is connected in series to a cell access transistor 3. The variable resistance element 2 is a two-port structure type nonvolatile semiconductor memory device arranged for, when receiving a first write voltage between the two ports, shifting its electrical resistance level from a first state to a second state and when receiving between the two ports a second write voltage which is opposite in the polarity to and different in the absolute value from the first write voltage, shifting the electrical resistance level from the second state to the first state thus to store information. The cell access transistor 3 is an n-channel MOSFET of enhancement type which is identical to a MOSFET constituting a peripheral circuit of the memory cell array, which will be described later, where the conductivity at both the source and the drain is of n type and the threshold voltage is a positive value (+0.1 V to +1.5 V for example). The cell access transistor 3 is connected at the gate to a word line WL, at the drain to a bit line BL, and at the source to one of the two ports (the second port) of the variable resistance element 2. The other port (the first port) of the variable resistance element 2 which is not connected to the cell access transistor 3 is connected to a source line SL. The fundamental arrangement of the memory cell is identical to that of the prior art shown in FIG. 15.

Alternatively, the cell access transistor 3 may be implemented by an electrically openable and closable switch which has the same switching function as the n-channel MOSFET of enhancement type. The switch is provided with a control port acting as the gate and a pair of, first and second, ports acting as the source and the drain and arranged for, when receiving a voltage at the control port, switching the conduction state on and off between the first port and the second port. This allows each selected memory cell to have a means for holding each port of the switch at a desired level of potential and driving the switch to electrically open and close thus to supply between the two ports of the variable resistance element with a desired level of voltage. As long as the switching element or means in the memory cell is functioned, there is no limitation for selection of a element used as the switch and for the electrical connection between terminals of the switch in the memory cell. Accordingly, the cell access transistor implemented by an n-channel MOSFET of enhancement type can be a favorable example of the switch.

It is now assumed in the following embodiments as well as this embodiment that the first writing action where the resistance level in the variable resistance element 2 is shifted from the first state (at a low resistance state for example) to the second state (at a high resistance state for example) represents "a programming action" while the second writing action where the resistance level in the variable resistance element 2 is shifted from the second state to the first state represents "an erasing action".

The variable resistance element 2 is commonly provided in the form of a three-layer structure which comprises a lower electrode, a variable resistor, and an upper electrode layered in this order. As described above, the variable resistance element 2 is arranged for, when receiving the first write voltage between its two ports, shifting the resistance level from the first state to the second state and when receiving between its two ports the second write voltage which is opposite in the polarity to and different in the absolute value from the first write voltage, shifting the resistance level from the second state to the first state is not limited in the shape or material. The material of the variable resistor may include manganese-containing perovskite type oxides expressed by $Pr_{(1-x)}Ca_xMnO_3$ (where 0<x<1) (thus, referred to as PCMO hereinafter) or TiN film, and the like. The variable resistor may be sandwiched between upper and lower by metal layers or electrically conductive oxide layers which contain a metal such as aluminum, copper, titanium, nickel, vanadium, zirconium, tungsten, cobalt, zinc, or iron, or nitride layers, or oxynitride layers. As long as a desired resistance state and a shift of the resistance state can be obtained by shifting the resistance level from the first state to the second state when the first write voltage is applied between its two ports and shifting the resistance level from the second state to the first state when the second write voltage is applied between its two ports, the variable resistor is not limited in the shape or material. Preferably, the material of the variable resistor may be selected from those listed above for providing desired properties.

Figure 2:
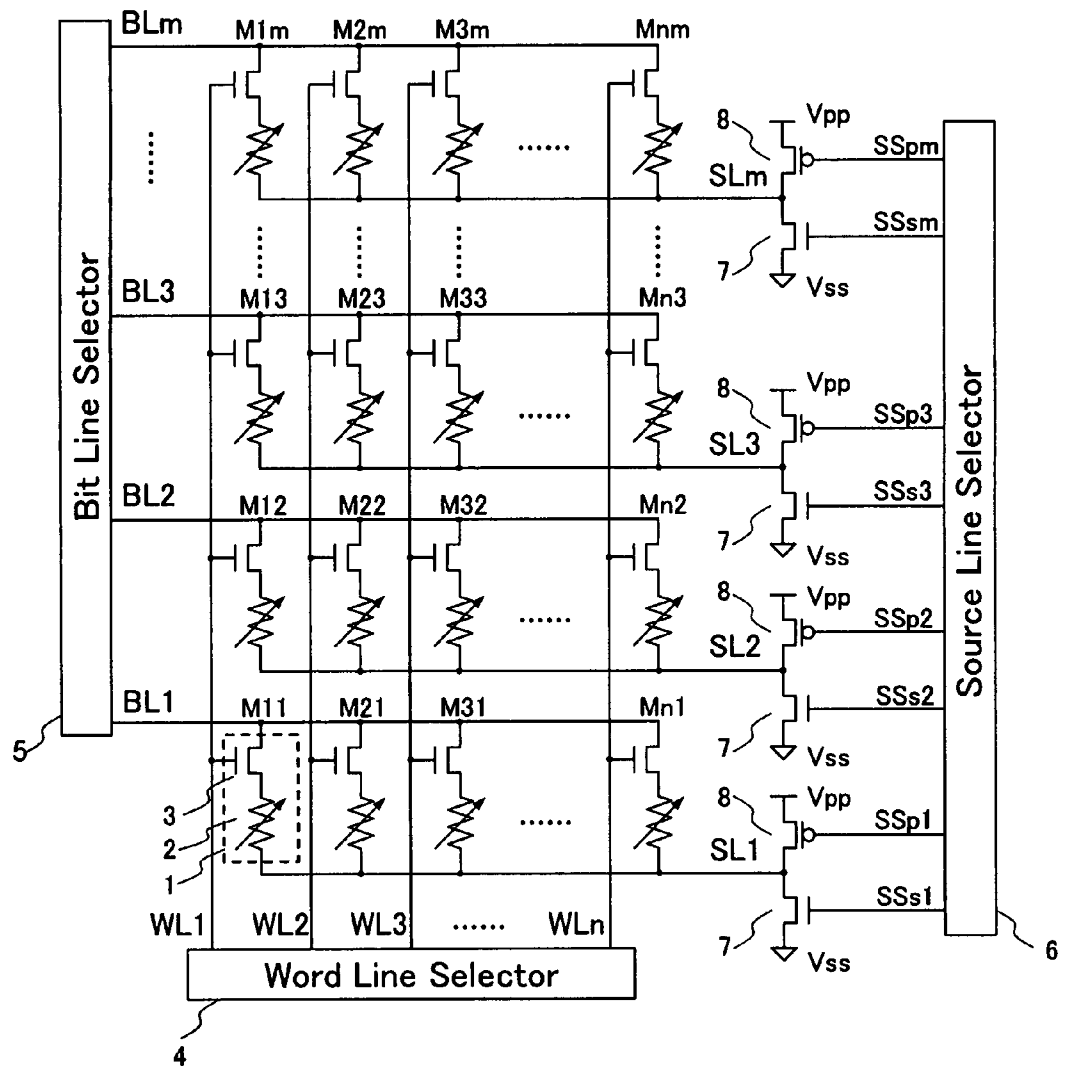
FIG. 2 is a circuitry diagram schematically showing an arrangement of a memory cell array accompanied with a peripheral circuit in the semiconductor memory device according to the first embodiment of the present invention.

FIG. 2 illustrates an exemplary arrangement of the memory cell array in the inventive device which is composed of the memory cells shown in FIG. 1. The memory cells 1 are arranged in a matrix along rows and columns. The memory cells 1 shown in FIG. 2 are denoted by M11 to M33, M1*m* to M3*m*, Mn1 to Mn3, and Mnm. The cell access transistors 3 in groups of the memory cells 1 aligned along the rows (in the vertical direction in FIG. 2) are connected at the gate to common word lines WLl to WLn. More specifically, the cell access transistors 3 in a group of the memory cells M11, M12, M13, . . . and M1*m* are connected at the gate to the common word line WL1. The cell access transistors 3 in groups of the memory cells 1 aligned along the columns (in the horizontal direction in FIG. 2) are connected at the drain to common bit lines BL1 to BLm. More specifically, the cell access transistors 3 in a group of the memory cells M11, M21, M31, . . . and Mn1 are connected at the drain to the common bit line BL1.

In the embodiment shown in FIG. 2, the variable resistance elements 2 in the memory cells 1 aligned along the column are connected at the first port to the common source lines SL1 to SLm. More specifically, the variable resistance elements 2 in the memory cells M1, M21, M31, . . . and Mn1 are connected at the first port to the common source line SL1. Each of the source lines SL1 to SLm is connected to a pair of an n-channel MOSFET 7 and a p-channel MOSFET 8 of the enhancement type for supplying the source line with a voltage. The n-channel MOSFET 7 serves as a voltage supplying driver for feeding a voltage Vss or its neighboring voltage (namely the grounding voltage) while the p-channel MOSFET 8 serves as a voltage supplying driver for feeding a voltage Vpp or its neighboring voltage (namely the positive voltage used for conducting the programming and erasing action). The gate of the n-channel MOSFET 7 is connected to one of source line selecting leads SSs1 to SSsm while the gate of the p-channel MOSFET 8 is connected to one of source line selecting leads SSp1 to SSpm.

A word line selector 4 is provided for supplying the word lines WL1 to WLn with a word line voltage required for conducting the programming action, the erasing action, or the reading action on the memory cells. A bit line selector 5 is provided for supplying the bit lines BL1 to BLm with a bit line voltage required for conducting the same action on the memory cells. A source line selector 6 is provided for supplying the source line selecting leads SSs1 to Sssm and SSp1 to SSpm with a voltage required for conducting the same action on the memory cells.

Figure 3:
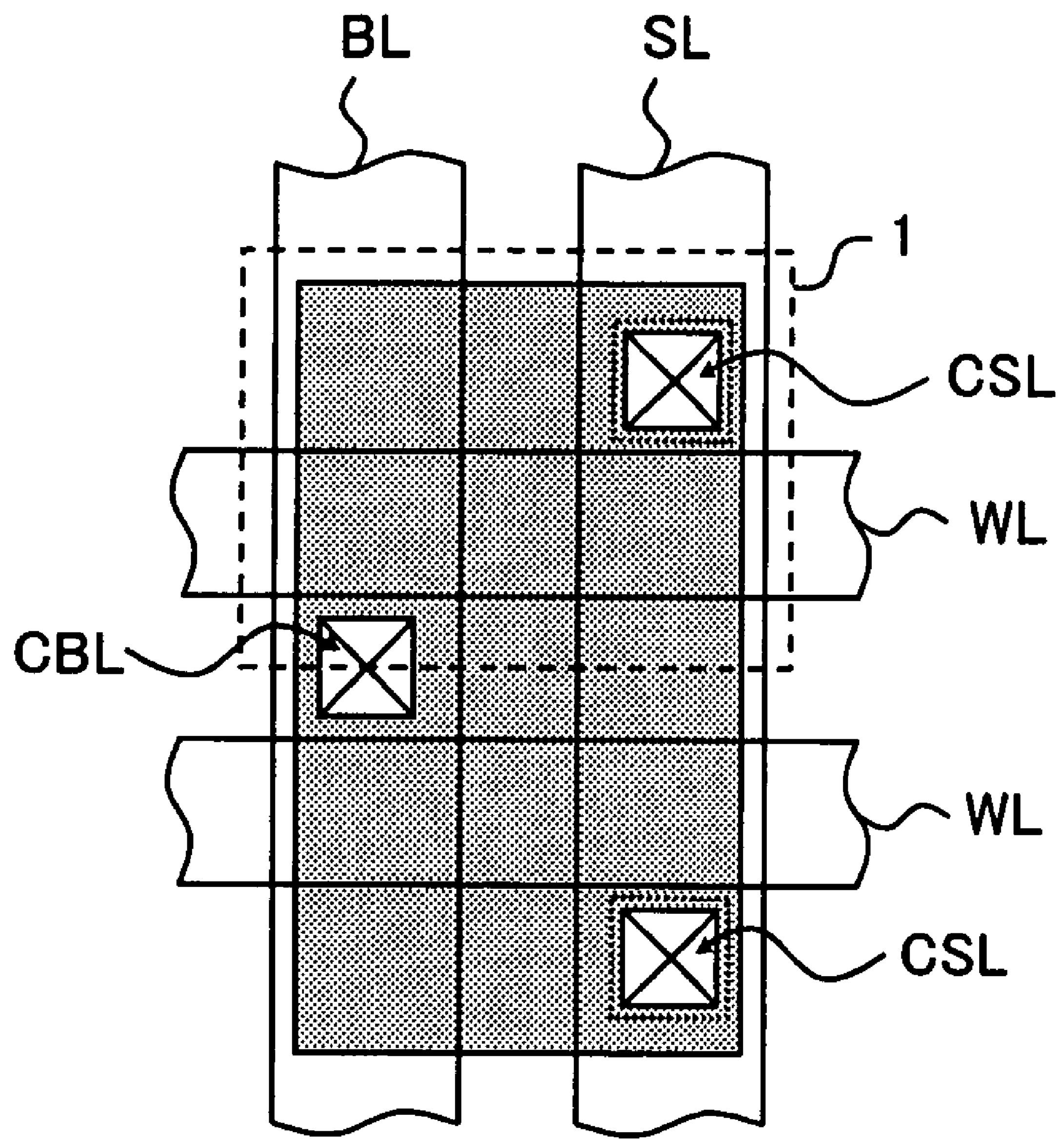
FIG. 3 is a schematic plan view showing a plan arrangement of the memory cells in the memory cell array in the semiconductor memory device according to the first embodiment of the present invention.
Figure 4:
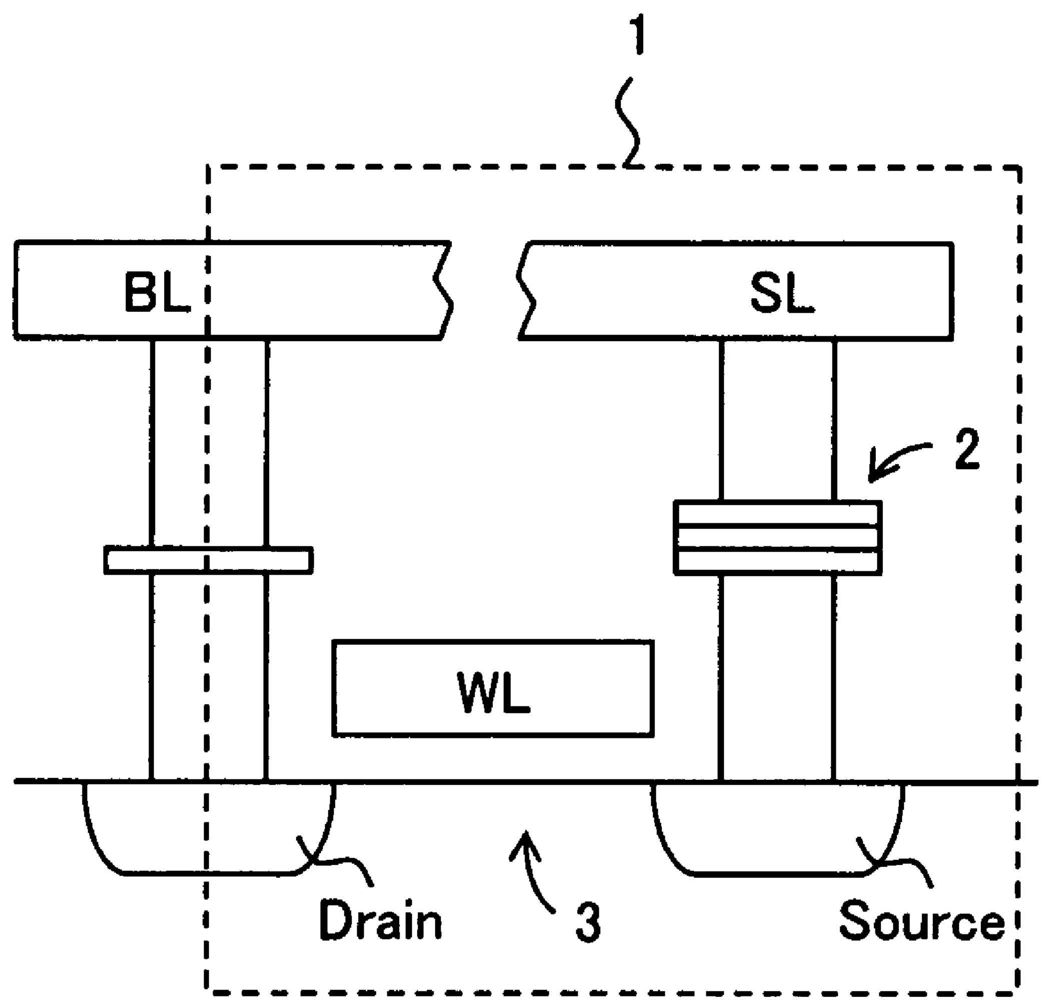
FIG. 4 is a schematic cross sectional view showing a cross sectional arrangement of the memory cells in the memory cell array in the semiconductor memory device according to the first embodiment of the present invention.

FIGS. 3 and 4 schematically illustrate a plan view and a cross sectional view of the circuitry arrangement of the memory cell in the memory cell array where the bit line and the source line extend in parallel along the columns as shown in FIG. 2. Shown in the left half of FIG. 4 is the cross section taken vertically along the center of the bit line. Shown in the right half of FIG. 4 is the cross section taken vertically along the center of the source line. As shown in FIGS. 2 and 3, the bit lines BL1 to BLm and the source lines SL1 to SLm are arranged alternatively in parallel, hence enabling the programming action or the erasing action on the memory cells aligned along each column. In FIG. 3, the rows extend in the horizontal direction while the columns extend in the vertical direction as they are turned 90 degrees from those of FIG. 2.

It is proved using a sample of the variable resistance element 2 of which the variable resistor is made of TiN that the variable resistance element 2 when receiving a voltage of +1.4 V (the first write voltage) at the two ports with reference to the upper electrode for a period of 20 ns, shifts its resistance state form a low resistance state to a high resistance state and when receiving a voltage of −2.4 V (the second write voltage) reversed in the polarity at the two ports for a period of 20 ns, shifts its resistance state from the high resistance state to the low resistance state. In that case, when the threshold voltage in the cell access transistor 3 of n-channel MOSFET type is set to 1 V, the absolute value Vpp of the voltages (the first write voltage and the second write voltage) to be applied between both ends of the memory cell can commonly be used at 2.4 V for conducting both the programming action and the erasing action.

The programming action and the erasing action on the memory cell array shown in FIG. 2 will now be described in more detail where the memory cell M22 is to be erased and programmed using the first write voltage (+1.4 V) and the second write voltage (−2.4 V). It is noted that the voltage at the signal lines (for example, the word lines) or at the nodes in the following embodiments as well as this embodiment is based on the grounding voltage (0 V) of the inventive device, unless otherwise specified, and its potential depends on those at the signal lines for example, the word lines) or at the nodes.

The programming action for shifting the resistance state of the variable resistance element 2 to the high resistance level will first be described. The action starts with the bit line selector 5 setting the voltage at the bit line BL2 to 2.4 V and the voltage at the other bit lines BL1 and BL3 to BLm to 0 V. Also, the source line selector 6 is operated to set the voltage at the source line selecting leads SSs1 to SSsm and SSp1 to SSpm to 2.4 V. As the result, the source lines SL1 to SLm are connected by their respective n-channel MOSFETs 7 connected to the source lines to 0 V. This allows the memory cells M12, M22, M32, . . . Mn2 connected between the bit line BL2 and the source line SL2 to be supplied with 2.4 V between the two ports while the other memory cells remain supplied with no voltage. At the time, the n-channel MOSFETs 7 connected to the source lines SL1 to SLm are supplied at the source with 0 V while the p-channel MOSFETs 8 connected to the source lines SL1 to SLm are supplied at the source with 2.4 V.

Moreover, the word line selector 4 is operated to set the voltage at the word line WL2 to 2.4 V while the other word lines WL1 and WL3 to WLn remain connected to 0 V. As the result, the cell access transistor 3 in the memory cell M22 is turned to the conductive state (turned on) while the cell access transistors 3 in the other memory cells M12, M32 to Mn2 remain at the non-conductive state (turned off). This allows the variable resistor element in the memory cell M22 to receive between the two ports the write voltage from the cell access transistor 3 which is at the conductive state. Simultaneously, the variable resistance element 2 in the memory cell M22 is supplied at the source line SL2 side or the first port with 0 V. The variable resistance element 2 is supplied at the bit line BL2 side or the second port with 1.4 V which is declined by an amplitude equal to the threshold voltage in the cell access transistor 3. Accordingly, the variable resistance element 2 receives +1.4 V of the first write voltage between its two ports. When the duration of applying the first write voltage is set to 20 ns, the variable resistance element 2 in the memory cell M22 shifts to the high resistance state. The duration of applying the first write voltage is determined by the duration when both the bit line BL2 and the word line WL2 is supplied with 2.4 V at the same time. In other words, the voltage application to the bit line BL2 at 2.4 V and the voltage application to the word line WL2 at the 2.4 V may arbitrarily be determined whichever comes earlier or ends later.

The action of selecting and programming another memory cell after the previously selected memory cell starts with the bit line selector 5 supplying the corresponding bit line connected to the another selected memory cell with 2.4 V and the other bit lines with 0 V. The source lines SL1 to SLm remain connected to 0 V regardless of the location of the another selected memory cell. Then, the word line selector 4 is operated to supply the corresponding word line connected to the another selected memory cell with 2.4 V and the other word lines with 0 V. As the result, the variable resistance element 2 in the another selected memory cell like the memory cell M22 is supplied with the first write voltage of +1.4 V between its two ports. When the duration of applying the first write voltage is set to 20 ns, the variable resistance element 2 in the another selected memory cell shifts to the high resistance state. By repeating the above steps, the memory cells of a desired group can be subjected in a sequence to the programming action.

The action of programming two or more of the memory cells at once may be carried out with the memory cells of a group to be subjected to the writing action at once being selected along one row or column. For example, when the memory cells aligned along one row are selected to be subjected to the programming action, their connecting bit lines are supplied with 2.4 V while the other bit lines remain connected to 0 V. When the memory cells of a group aligned along one column is selected and subjected to the programming action at once, their connecting word lines are supplied with 2.4 V while the other word lines remain connected to 0 V.

Then, the action of erasing the memory cell M22 through shifting the resistance state of its variable resistance element 2 to the low resistance state will now be described in more detail using the first write voltage (+1.4 V) and the second write voltage (−2.4 V).

The erasing action starts with the bit line selector 5 setting the voltage at all the bit lines BL1 to BLm to 0 V. Also, the source line selector 6 is operated to set the voltage at the two source line selecting leads SSs2 and SSp2 to 0 V and the other source line selecting leads SSs1, SSs3 to SSsm, SSp1, and SSp3 to SSpm to 2.4 V. As the result, the p-channel MOSFET 8 connected to the source line SL2 turns to the conductive state while the n-channel MOSFET 7 connected to the source line SL2 remains at the non-conductive state, and thus the source line SL2 is supplied with 2.4 V through the p-channel MOSFET 8. Simultaneously, since the n-channel MOSFET 7 turns to the conductive state while the p-channel MOSFET 8 remains at the non-conductive state, the other source lines SL1 and SL3 to SLm are supplied with 0 V. This allows the memory cells M12, M22, M32, . . . Mn2 connected between the bit line BL2 and the source line SL2 to be supplied with 2.4 V between the two ports while the other memory cells remain supplied with no voltage.

Also, the word line selector 4 is operated to set the voltage at the word line WL2 to 2.4 V while the other word lines WL1 and WL3 to WLn remain connected to 0 V. As the result, the cell access transistor 3 in the memory cell M22 is turned to the conductive state while the cell access transistors 3 in the other memory cells M12, M32 to Mn2 remain at the non-conductive state. This allows the variable resistor element in the memory cell M22 to receive between the two ports the write voltage which is opposite in the polarity to that in the programming action as received the cell access transistor 3 which is at the conductive state. Simultaneously, the variable resistance element 2 in the memory cell M22 is supplied at the source line SL2 side or the first port with 2.4 V. The variable resistance element 2 is supplied at the bit line BL2 side or the second port with 0 V because the cell access transistor 3 is made of n-channel MOSFET type. Accordingly, the variable resistance element 2 receives the second writing voltage of −2.4 V between its two ports. When the duration of applying the second write voltage is set to 20 ns, the variable resistance element 2 in the memory cell M22 shifts to the low resistance state.

The action of erasing all the memory cells in the memory cell array at once starts with the bit line selector 5 supplying all the bit lines BL1 to BLm with 0 V. Then, the source line selector 6 is operated to supply all the source line selecting leads SSs1 to SSsm and SSp1 to SSpm with 0 V. As the result, the source lines SL1 to SLm are supplied with 2.4 V from their respective p-channel MOSFETs 8. Also, the word line selector 4 is operated to supply all the word lines WL1 to WLn with 2.4 V. This allows all the cell access transistors 3 in the memory cells to be turned to the conductive state thus to supply their respective variable resistance elements 2 with the second write voltage of 2.4 V between the two ports. When the duration of applying the second write voltage is set to 20 ns, the variable resistance elements 2 in all the memory cells shift to the low resistance state. In case that the supply of current from the source line selector 6 is found unfavorable because all the memory cells draw their erasing currents at the same time during the action of erasing all the memory cells at once, the word lines may be separated into groups and the word line selector 4 supplies each group of the word lines with 2.4 V in sequence, and thus erasing the entire of the memory cell array.

SECOND EMBODIMENT

Figure 5:
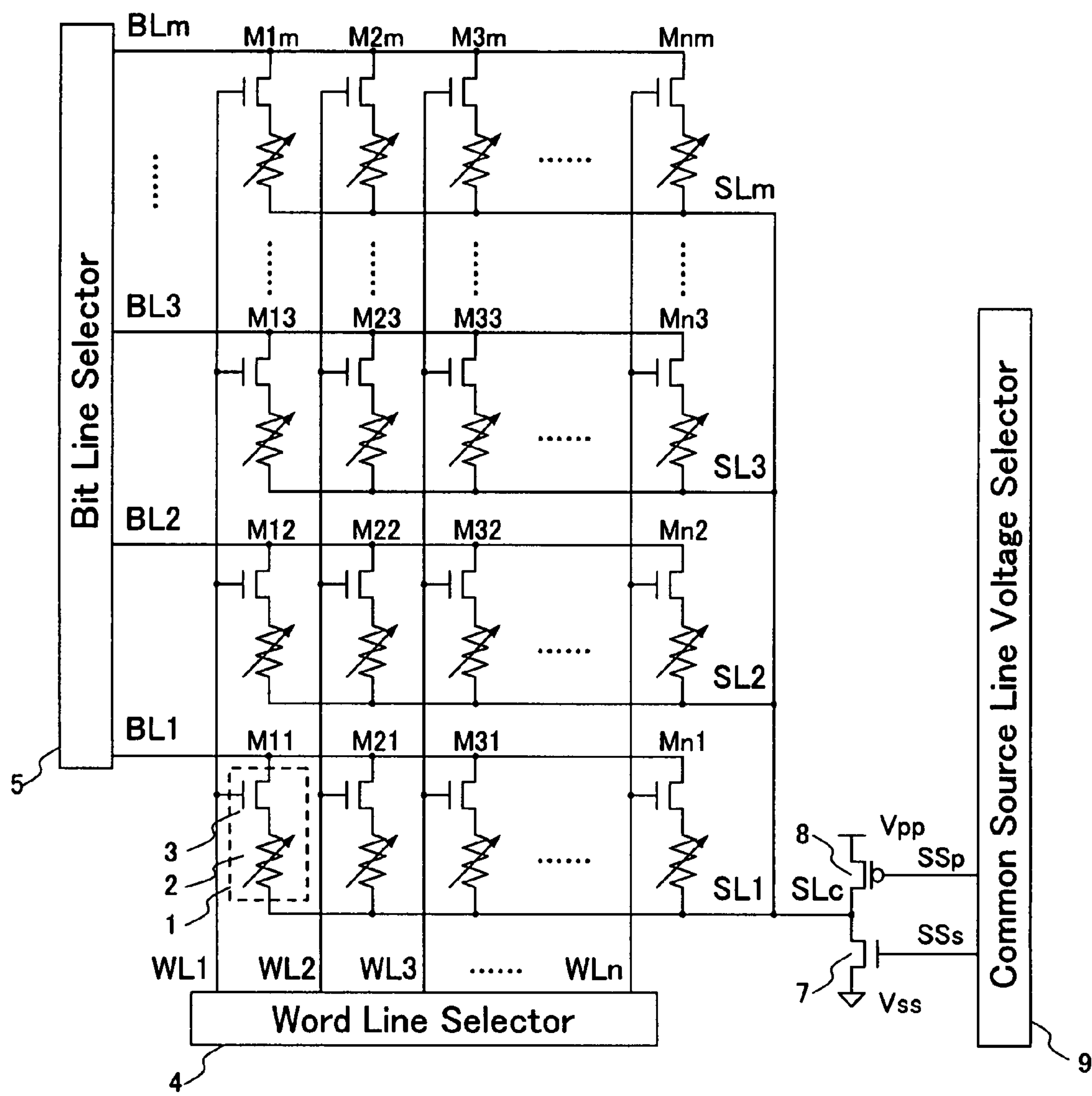
FIG. 5 is a circuitry diagram schematically showing an arrangement of a memory cell array accompanied with a peripheral circuit in the semiconductor memory device according to the second embodiment of the present invention.

FIG. 5 schematically illustrates an arrangement of a memory cell array in the second embodiment of the inventive device. The memory cell in the second embodiment is substantially identical in the arrangement to that of the first embodiment shown in FIG. 1. The arrangement of the memory cell array shown in FIG. 5 is also equal to that of the memory cell array of the first embodiment shown in FIG. 2, except for the connection of the source lines. The connection of the source lines will only be described while the explanation of the other common arrangement is omitted. Like components in the memory cell array shown in FIG. 5 are denoted by like numerals as those in the memory cell array shown in FIG. 2 and will be described in no more detail.

The memory cell array shown in FIG. 5 is arranged in which the source lines SL1 to SLm extending in parallel along the columns are connected to a common source line SLc. The common source line SLc is in turn connected with a pair of an n-channel MOSFET 7 and a p-channel MOSFET 8 of enhancement type for supplying the voltage. The n-channel MOSFET 7 serves as a voltage supplying driver for supplying a voltage Vss or its neighboring voltage (namely the grounding voltage) while the p-channel MOSFET 8 serves as a voltage supplying driver for supplying a voltage Vpp or its neighboring voltage (the positive voltage used for conducting the programming action or the erasing action). The gate of the n-channel MOSFET 7 is connected to a common source line voltage selecting lead SSs while the gate of the p-channel MOSFET 8 is connected to a common source line voltage selecting lead SSp. A common source line voltage selector 9 is provided for feeding the common source line voltage selecting leads SSs and SSp with voltages required for conducting the programming action and the erasing action.

The memory cell array shown in FIG. 5 is arranged similar to the memory cell array of the first embodiment shown in FIG. 2 and schematically illustrated in the plan view of FIG. 3 and the cross sectional view of FIG. 4.

The programming action and the erasing action on one selected memory cell, denoted by M22, in the memory cell array shown in FIG. 5 will be described in conjunction with the same writing properties as of the memory cell in the first embodiment.

The programming action for shifting the resistance state of the variable resistance element 2 to a high resistance state will first be described. The action starts with the bit line selector 5 setting the voltage at the bit line BL2 to 2.4 V and the voltage at the other bit lines BL1 and BL3 to BLm to 0 V. Also, the common source line voltage selector 9 is operated to set the voltage at both the source line voltage selecting leads SSs and SSp to 2.4 V. As the result, the common source line SLc is connected by its n-channel MOSFET 7 to 0 V. Since the source lines SL1 to SLm are connected to the common source line SLc, they receive 0 V. This allows the memory cells M12, M22, M32, . . . Mn2 connected between the bit line BL2 and the source line SL2 to be supplied with 2.4 V between the two ports while the other memory cells remain supplied with no voltage. At the time, the n-channel MOSFET 7 connected to the common source line SLc is supplied at the source with 0 V while the p-channel MOSFET 8 connected to the common source lines SLc is supplied at the source with 2.4 V.

Moreover, the word line selector 4 is operated to set the voltage at the word line WL2 to 2.4 V while the other word lines WL1 and WL3 to WLn remain connected to 0 V. As the result, the cell access transistor 3 in the memory cell M22 is turned to the conductive state (turned on) while the cell access transistors 3 in the other memory cells M12, M32 to Mn2 remain at the non-conductive state (turned off). This allows the variable resistor element in the memory cell M22 to receive between the two ports the write voltage from the cell access transistor 3 which is at the conductive state. Simultaneously, the variable resistance element 2 in the memory cell M22 is supplied at the source line SL2 side or the first port with 0 V. The variable resistance element 2 is supplied at the bit line BL2 side or the second port with 1.4 V which is declined by an amplitude equal to the threshold voltage in the cell access transistor 3. Accordingly, the variable resistance element 2 receives the first write voltage of +1.4 V between its two ports. When the duration of applying the first write voltage is set to 20 ns, the variable resistance element 2 in the memory cell M22 shifts to the high resistance state.

The action of selecting and programming another memory cell after the previously selected memory cell starts with the bit line selector 5 supplying the corresponding bit line connected to the another selected memory cell with 2.4 V and the other bit lines with 0 V. As equal to the step described previously, the source lines SL1 to SLm remain connected to 0 V regardless of the location of the another selected memory cell. Then, the word line selector 4 is operated to supply the corresponding word line connected to the another selected memory cell with 2.4 V and the other word lines with 0 V. As the result, the variable resistance element 2 in the another selected memory cell like the memory cell M22 is supplied with the first write voltage of +1.4 V between its two ports. When the duration of applying the first write voltage is set to 20 ns, the variable resistance element 2 in the another selected memory cell shifts to the high resistance state. By repeating the above steps, the memory cells of a desired group can be subjected in a sequence to the programming action.

The action of programming two or more of the memory cells at once may be carried out with the memory cells of a group to be subjected to the writing action at once being selected along one row or column. For example, when the memory cells aligned along one row are selected to be subjected to the programming action, the bit lines connected to the selected memory cells are supplied with 2.4 V while the other bit lines remain connected to 0 V. When the memory cells aligned along one column are selected to be subjected to the programming action at once, the word lines connected to the selected memory cells are supplied with 2.4 V while the other word lines remain connected to 0 V.

Then, the action of erasing the memory cell M22 through shifting the resistance state of its variable resistance element 2 to the low resistance state will now be described in more detail using the first write voltage (+1.4 V) and the second write voltage (−2.4 V).

The erasing action starts with the common source line voltage selector 9 setting the voltage at both the common source line voltage selecting leads SSs and SSp with 0 V thus to turn the n-channel MOSFET 7 connected to the common source line SLc to the non conductive state and the p-channel MOSFET 8 to the conductive state, hence permitting the common source line SLc to receive 2.4 V from the p-channel MOSFET 8. Also, the bit line selector 5 is operated to set the voltages at the bit lines BL1 and BL3 to BLm to 2.4 V and at the bit line BL2 to 0 V. This allows the memory cells M12, M22, M32, . . . Mn2 connected between the bit line BL2 and the source line SL2 to be supplied with 2.4 V between the two ports while the other memory cells remain supplied with no voltage.

Also, the word line selector 4 is operated to set the voltage at the word line WL2 to 2.4 V while the other word lines WL1 and WL3 to WLn remain connected to 0 V. As the result, the cell access transistor 3 in the memory cell M22 is turned to the conductive state while the cell access transistors 3 in the other memory cells M12, M32 to Mn2 remain at the non-conductive state. This allows the variable resistor element in the memory cell M22 to receive between the two ports the write voltage which is opposite in the polarity to that in the programming action as received from the cell access transistor 3 which is at the conductive state. Simultaneously, the variable resistance element 2 in the memory cell M22 is supplied at the source line SL2 side or the first port with 2.4 V. The variable resistance element 2 is supplied at the bit line BL2 side or the second port with 0 V because the cell access transistor 3 is made of n-channel MOSFET type. Accordingly, the variable resistance element 2 receives the second write voltage of −2.4 V between its two ports. When the duration of applying the second write voltage is set to 20 ns, the variable resistance element 2 in the memory cell M22 shifts to the low resistance state.

The action of erasing all the memory cells in the memory cell array of interest at once starts with the bit line selector 5 supplying all the bit lines BL1 to BLm with 0 V. Then, the source line voltage selector 9 is operated to supply both the source line voltage selecting leads SSs and SSp with 0 V. As the result, the common source line SLc is supplied with 2.4 V from the p-channel MOSFET 8 connected to the common source line SLc. Also, the word line selector 4 is operated to supply all the word lines WL1 to WLn with 2.4 V. This allows all the cell access transistors 3 in the memory cells to be turned to the conductive state thus to supply their respective variable resistance elements 2 with the second write voltage of −2.4 V between the two ports. When the duration of applying the second write voltage is set to 20 ns, the variable resistance elements 2 in all the memory cells shift to the low resistance level. In case that the supply of current from the source line selector 6 is found unfavorable because all the memory cells draw their erasing currents at the same time during the action of erasing all the memory cells at once, the word lines may be separated into groups and the word line selector 4 supplies each group of the word lines with 2.4 V in sequence, and thus erasing the entire of the memory cell array.

THIRD EMBODIMENT

Figure 6:
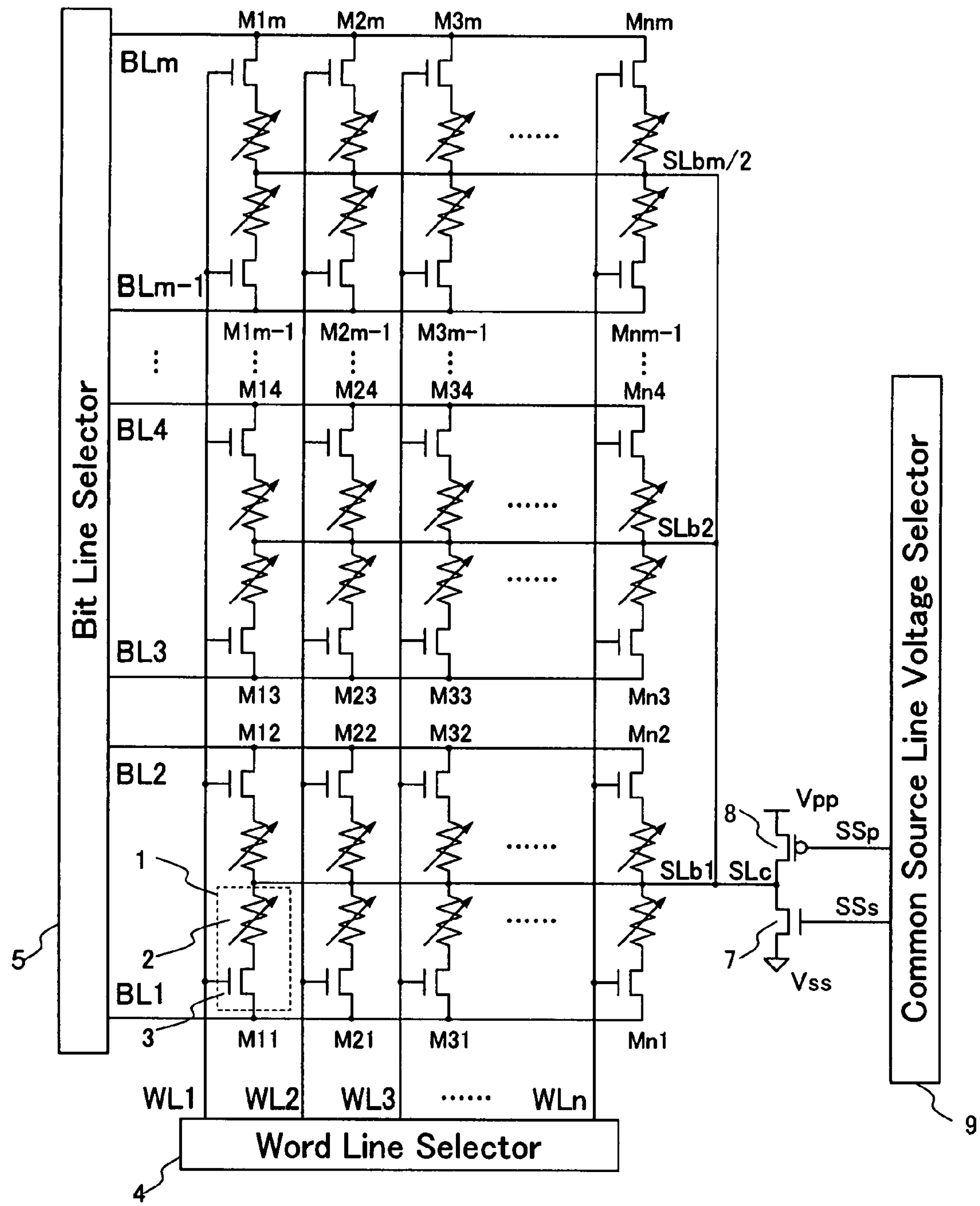
FIG. 6 is a circuitry diagram schematically showing an arrangement of a memory cell array accompanied with a peripheral circuit in the semiconductor memory device according to the third embodiment of the present invention.

FIG. 6 schematically illustrates an arrangement of a memory cell array in the third embodiment of the inventive device. The memory cell in the third embodiment is substantially identical in the arrangement to that of the first embodiment shown in FIG. 1. The memory cell array shown in FIG. 6 is also equal in the arrangement of electrical equivalent circuit to but smaller in the layout area than the memory cell array of the second embodiment shown in FIG. 5.

As shown in FIG. 6, the memory cell array in the third embodiment is arranged in which one source line is commonly provided between any two adjacent columns. Accordingly, the source line extends along and between any two adjacent bit lines (in the horizontal direction shown in FIG. 6) and the number of the source lines in the memory cell array can be decreased to a half as compared with that in the second embodiment.

Figure 7:
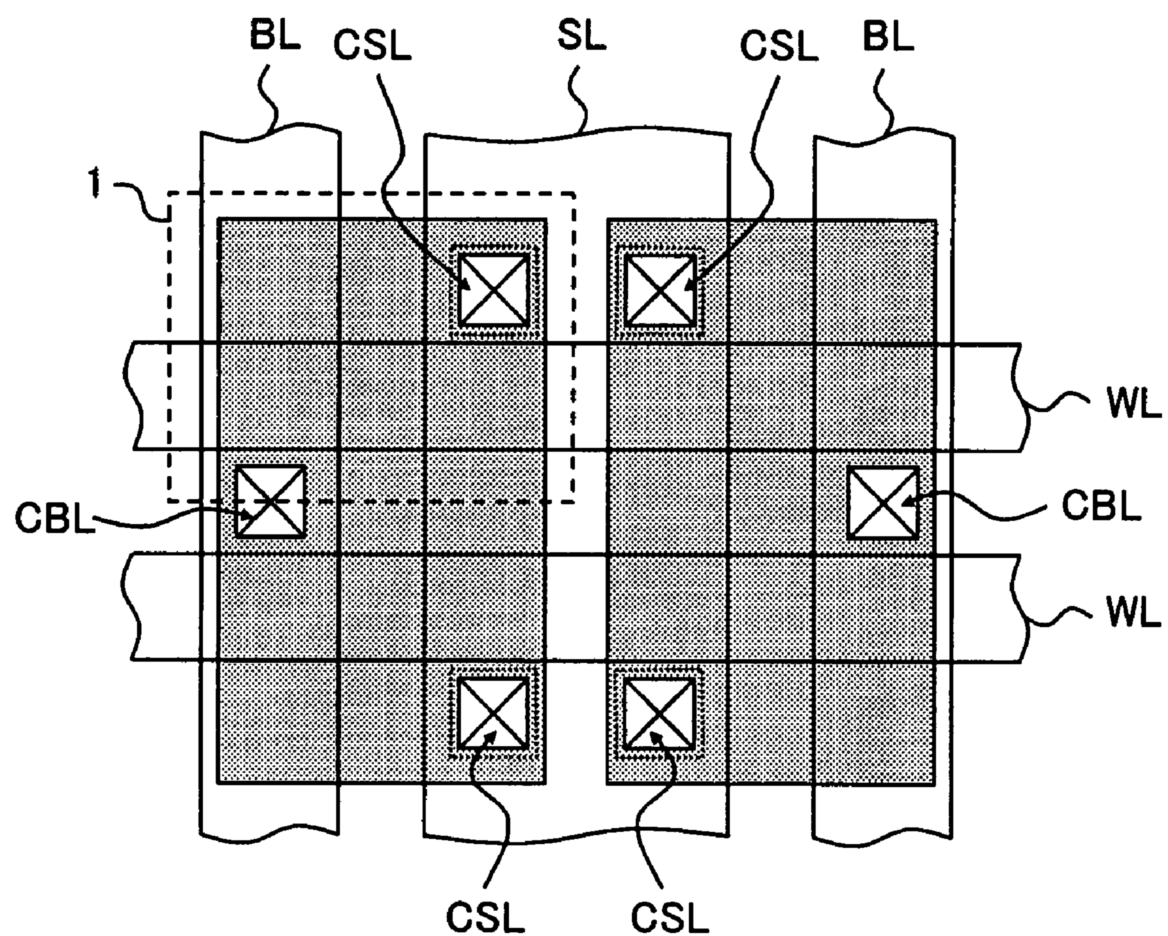
FIG. 7 is a schematic plan view showing a plan arrangement of the memory cells in the memory cell array in the semiconductor memory device according to the third embodiment of the present invention.

FIG. 7 schematically illustrates a plan view of the memory cell array shown in FIG. 6. In FIG. 7, four of the memory cells along two rows and two columns are illustrated partially. Each memory cell is defined in a square denoted by the broken line. The arrangement of FIG. 7 is turned 90 degrees from that of FIG. 6, where the rows extend in the horizontal direction while the columns extend in the vertical direction. One source line SL is provided between two bit lines BL in FIG. 7. A bit line contact CBL for connecting the bit line BL to the drain of a cell access transistor is provided as shared by two adjacent memory cells arranged along the column. Each of the four memory cells has a source line contact CSL provided for connecting the upper electrode (the first port) of its variable resistance element to the source line SL and the variable resistance element is located beneath the source line contact CSL. The cross section of the memory cell is identical to that shown in FIG. 4.

The action of programming and erasing the memory cell array shown in FIG. 6 is identical to that of the second embodiment and will be explained in no more detail.

FOURTH EMBODIMENT

Figure 8:
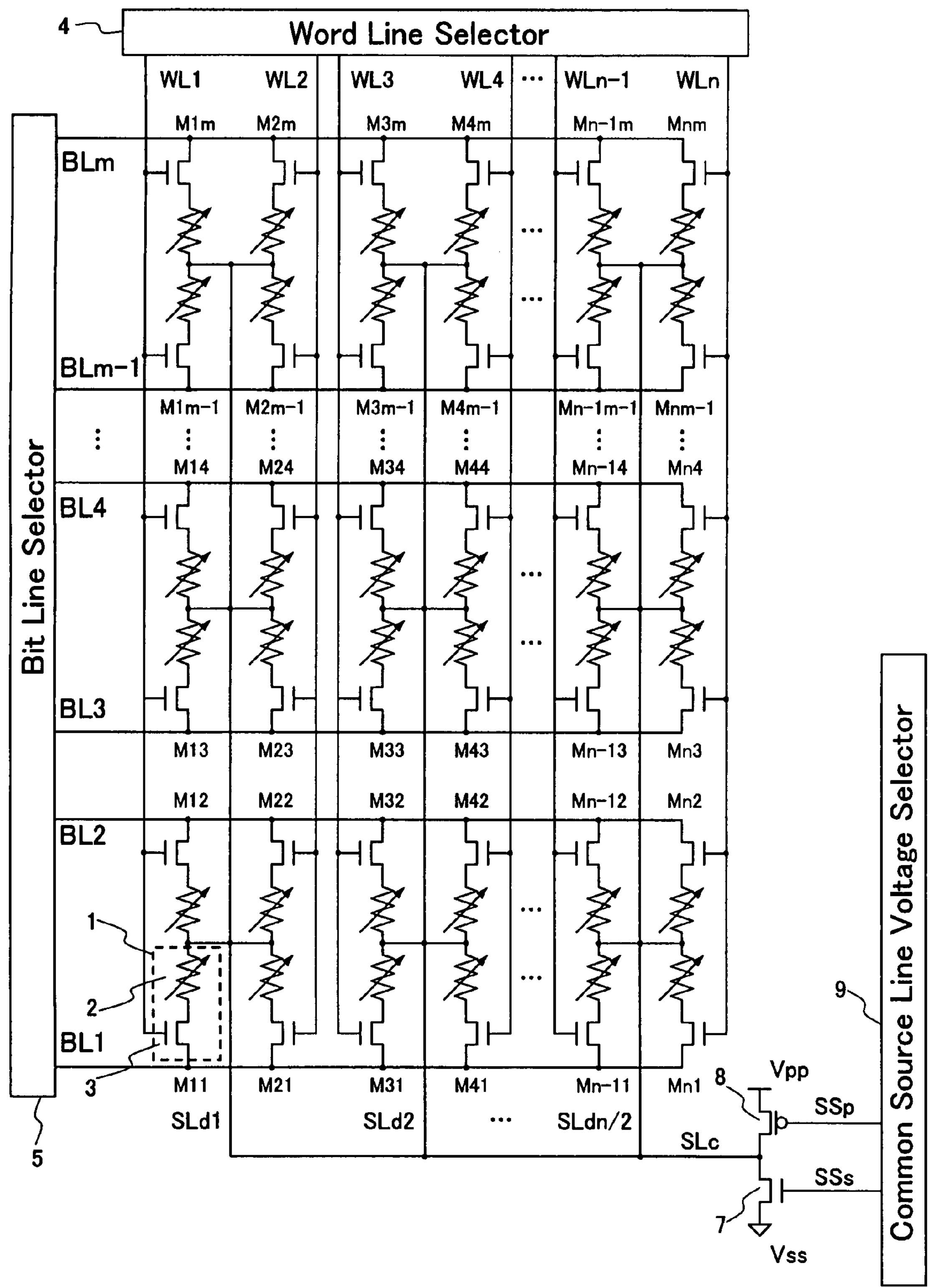
FIG. 8 is a circuitry diagram schematically showing an arrangement of a memory cell array accompanied with a peripheral circuit in the semiconductor memory device according to the fourth embodiment of the present invention.

FIG. 8 schematically illustrates an arrangement of a memory cell array in the fourth embodiment of the inventive device. The memory cell in the fourth embodiment is substantially identical in the arrangement to that of the first embodiment shown in FIG. 1. The memory cell array shown in FIG. 6 is also equal in the arrangement of electrical equivalent circuit to but smaller in the layout area than the memory cell array of the second embodiment shown in FIG. 5.

As shown in FIG. 8, the memory cell array in the fourth embodiment is arranged in which one source line is commonly provided between any two adjacent rows (which extend in the vertical direction in FIG. 8). Accordingly, the source line extends along and between any two adjacent word lines and the number of the source lines in the memory cell array can be decreased to a half as compared with the number of the word lines.

Figure 9:
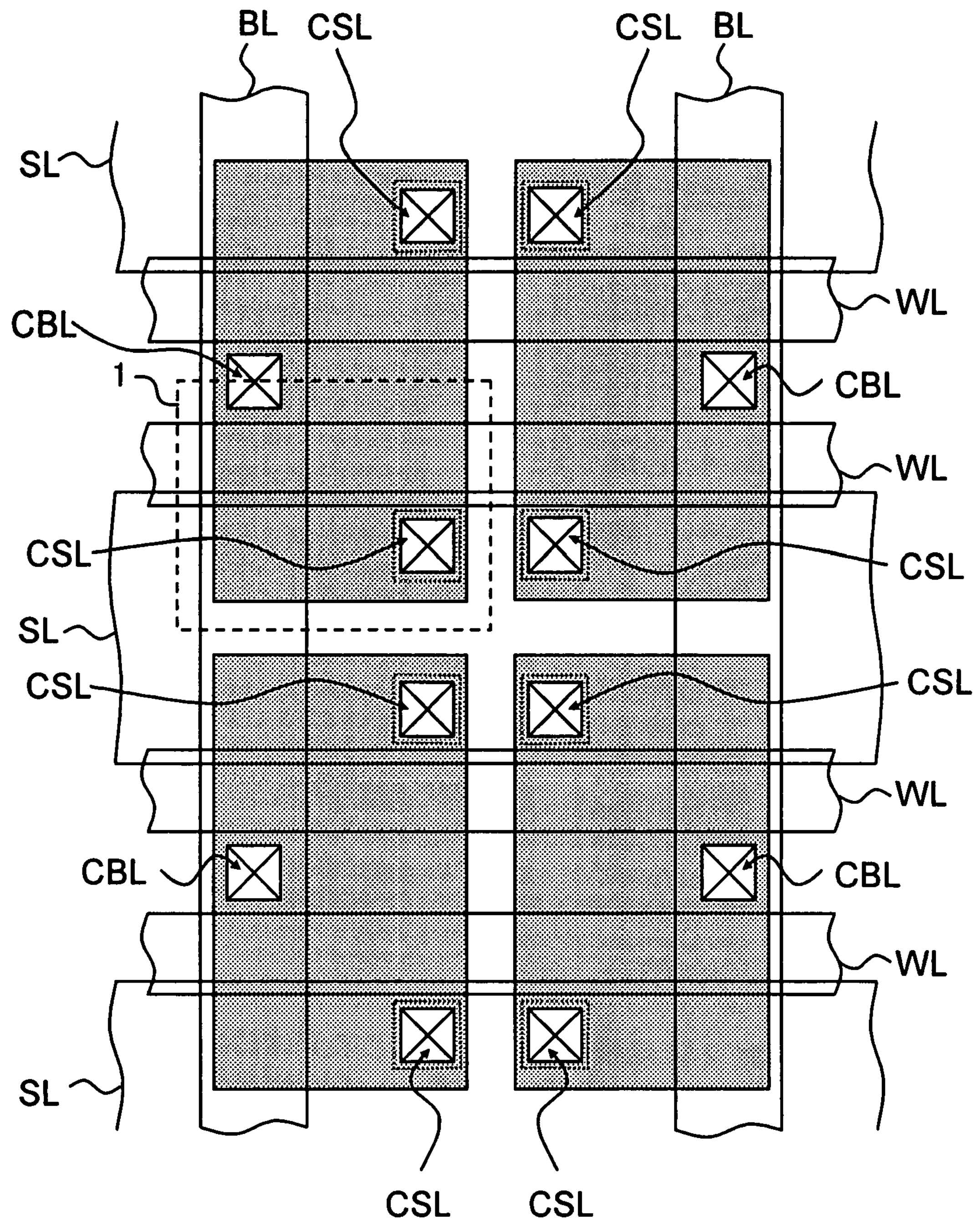
FIG. 9 is a schematic plan view showing a plan arrangement of the memory cells in the memory cell array in the semiconductor memory device according to the fourth embodiment of the present invention.
Figure 10:
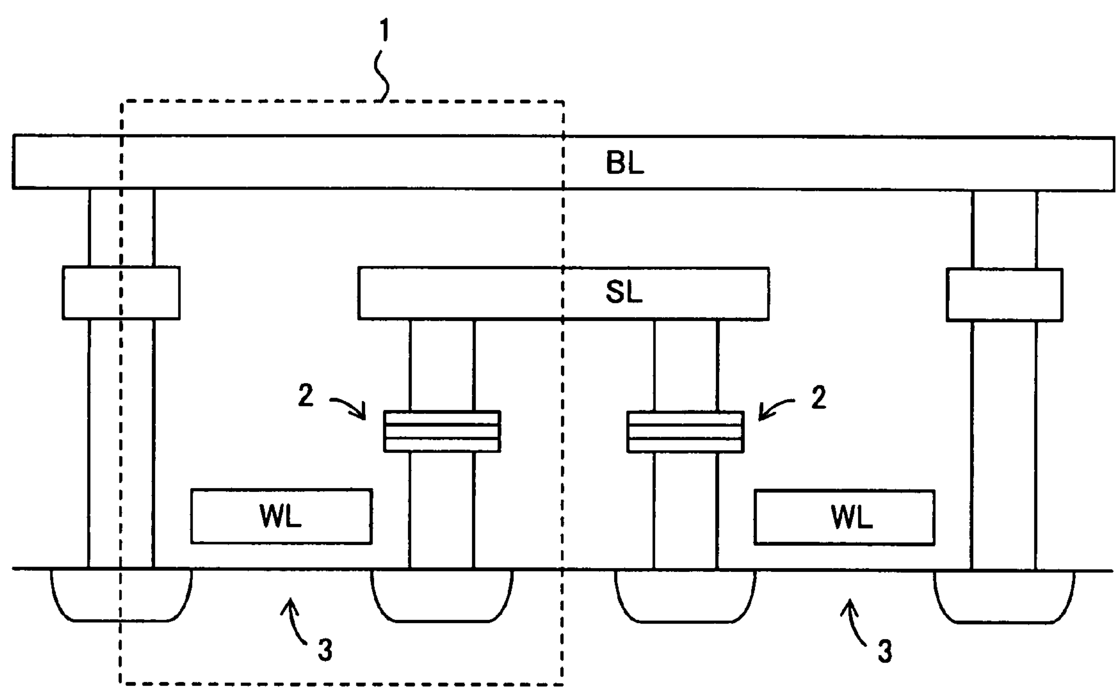
FIG. 10 is a schematic cross sectional view showing a cross sectional arrangement of the memory cells in the memory cell array in the semiconductor memory device according to the fourth embodiment of the present invention.

FIG. 9 schematically illustrates a plan view of the memory cell array shown in FIG. 8. In FIG. 9, eight of the memory cells along four rows and two columns are illustrated partially. Each memory cell is defined in a square denoted by the broken line. The arrangement of FIG. 9 is turned 90 degrees from that of FIG. 8, where the rows extend in the horizontal direction while the columns extend in the vertical direction. One source line SL is provided between two word lines WL in FIG. 9. A bit line contact CBL for connecting the bit line BL to the drain of a cell access transistor is provided as shared by two adjacent memory cells arranged along the column. Each of the eight memory cells has a source line contact CSL provided for connecting the upper electrode (the first port) of its variable resistance element to the source line SL and the variable resistance element is located beneath the source line contact CSL. FIG. 10 illustrates a cross sectional view of the memory cell in this embodiment.

The action of programming and erasing the memory cell array shown in FIG. 8 is identical to that of the second embodiment and will be explained in no more detail.

FIFTH EMBODIMENT

Figure 11:
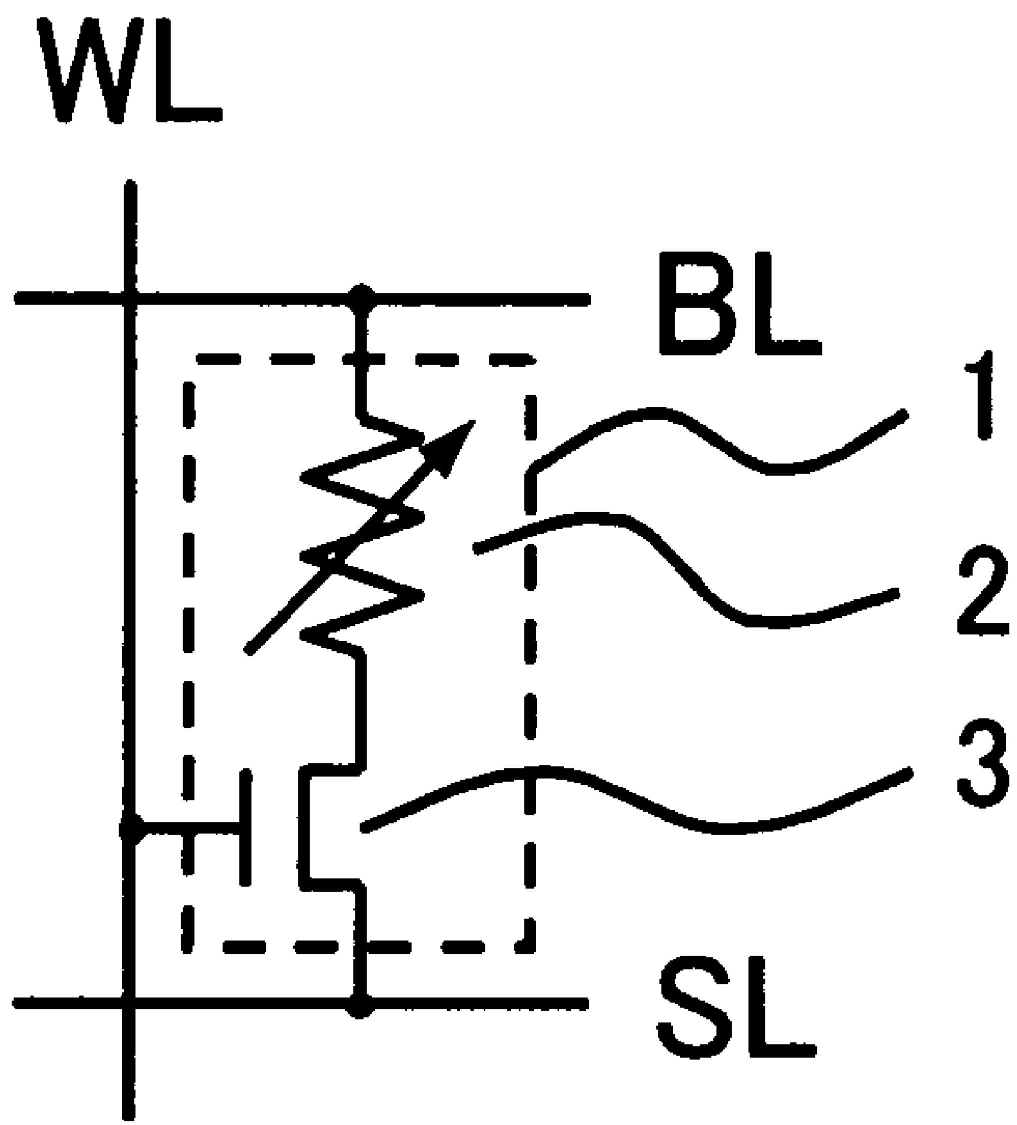
FIG. 11 is a circuitry diagram schematically showing an arrangement of a memory cell in a semiconductor memory device according to the fifth embodiment of the present invention.

FIG. 11 schematically illustrates an arrangement of a memory cell in the fifth embodiment of the inventive device. As shown in FIG. 5, the memory cell 1 is of 1T1R type which comprises a variable resistance element 2 and a cell access transistor 3. The variable resistance element 2 similar to that of the first to fourth embodiments is a nonvolatile memory element having two-port structure arranged for, when receiving a first write voltage between its two ports, shifting the electrical resistance level from a first state to a second state and, when receiving between the two ports a second write voltage which is opposite in the polarity to and different in the absolute value from the first write voltage, shifting the resistance level from the second state to the first state thus to store information. The cell access transistor 3 is an n-channel MOSFET of enhancement type similar to that of the first to fourth embodiments. The cell access transistor 3 is connected at the gate to a word line WL and at the drain to one end (the second port) of the variable resistance element 2. The other end (the first port) of the variable resistance element 2 which is not connected to the cell access transistor 3 is connected to a bit line BL. The source of the cell access transistor 3 is connected to a source line SL. The memory cell of this embodiment is differentiated from that of the first to fourth embodiments by the fact that the connection of the variable resistance element 2 and the cell access transistor 3 to the bit line BL and the source line SL is reversed.

Figure 12:
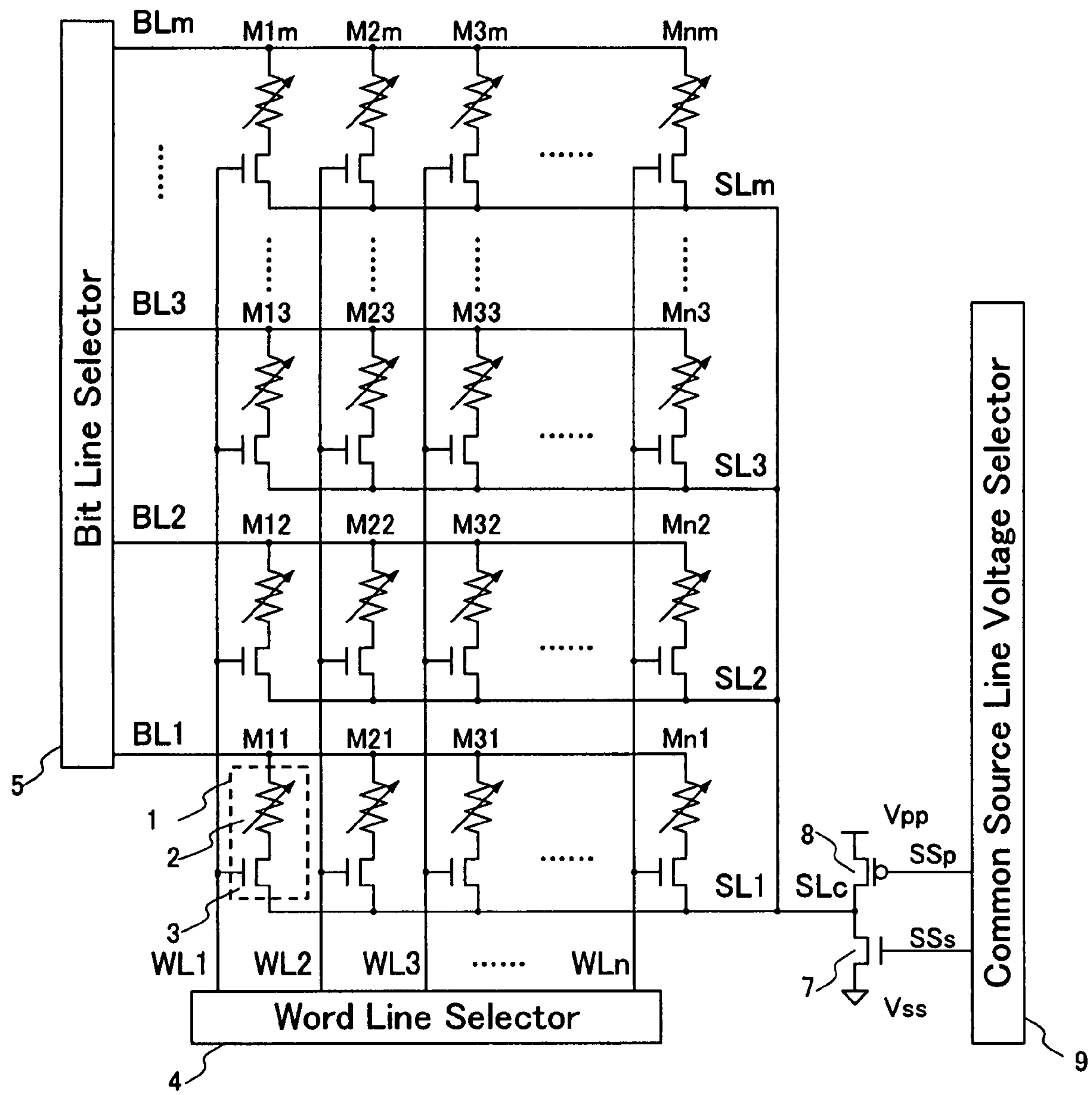
FIG. 12 is a circuitry diagram schematically showing an arrangement of a memory cell array accompanied with a peripheral circuit in the semiconductor memory device according to the fifth embodiment of the present invention.

The memory cells shown in FIG. 11 can be arrayed to build a memory cell array such as described in the first to fourth embodiment (shown in FIGS. 2, 5, 6, and 8) where the source lines are varied in the arrangement. For example, a memory cell array similar to that of the second embodiment is shown in FIG. 12 where the source lines extending along the columns are arranged for each column. The memory cell is equal in the arrangement to that shown in FIG. 5 except for the respective arrangement of the memory cell.

The programming action and the erasing action on the memory cell array shown in FIG. 12 will now be described in more detail where the memory cell M22 is to be erased and programmed using the same writing conditions as those of the first embodiment.

The programming action for shifting the resistance state of the variable resistance element 2 to the high resistance state will first be described. The action starts with the bit line selector 5 setting the voltage at the bit line BL2 to 0 V and the voltage at the other bit lines BL1 and BL3 to BLm to 2.4 V. Also, the source line voltage selector 9 is operated to set the voltage at both the source line voltage selecting leads SSs and SSp to 0 V. As the result, the common source line SLc is connected by its corresponding p-channel MOSFET 8 to 2.4 V. Since the source lines SL1 to SLm are connected to the common source line SLc, they receive 2.4 V. This allows the memory cells M12, M22, M32, . . . Mn2 connected between the bit line BL2 and the source line SL2 to be supplied with 2.4 V between the two ports while the other memory cells remain supplied with no voltage. At the time, the n-channel MOSFET 7 connected to the common source line SLc is applied at the source with 0 V while the p-channel MOSFET 8 connected to the common source line SLc is applied at the source with 2.4 V.

Moreover, the word line selector 4 is operated to set the voltage at the word line WL2 to 2.4 V while the other word lines WL1 and WL3 to WLn remain connected to 0 V. As the result, the cell access transistor 3 in the memory cell M22 is turned to the conductive state (turned on) while the cell access transistors 3 in the other memory cells M12, M32 to Mn2 remain at the non-conductive state (turned off). This allows the variable resistor element in the memory cell M22 to receive between the two ports the write voltage from the cell access transistor 3 which is at the conductive state. Simultaneously, the variable resistance element 2 in the memory cell M22 is supplied at the bit line BL2 side or the first port with 0 V. The variable resistance element 2 is supplied at the source line SL2 side or the second port with 1.4 V which is declined by an amplitude equal to the threshold voltage in the cell access transistor 3. Accordingly, the variable resistance element 2 receives the first write voltage of +1.4 V between its two ports. When the duration of applying the first write voltage is set to 20 ns, the variable resistance element 2 in the memory cell M22 shifts to the high resistance state.

Then, the action of erasing the memory cell M22 through shifting the resistance state of its variable resistance element 2 to the low resistance state will now be described in more detail using the first write voltage (+1.4 V) and the second write voltage (−2.4 V).

The erasing action starts with the common source line voltage selector 9 setting the voltage at both the common source line voltage selecting leads SSs and SSp to 2.4 V thus to turn the p-channel MOSFET 8 connected to the common source line SLc to the non conductive state and the n-channel MOSFET 7 to the conductive state, hence permitting the common source line SLc to receive 0 V from the n-channel MOSFET 7. Also, the bit line selector 5 is operated to set the voltage at the bit lines BL1 and BL3 to BLm to 0 V and at the bit line BL2 to 2.4 V. This allows the memory cells M12, M22, M32, . . . Mn2 connected between the bit line BL2 and the source line SL2 to be supplied with 2.4 V between the two ports while the other memory cells remain supplied with no voltage.

Also, the word line selector 4 is operated to set the voltage at the word line WL2 to 2.4 V while the other word lines WL1 and WL3 to WLn remain connected to 0 V. As the result, the cell access transistor 3 in the memory cell M22 is turned to the conductive state while the cell access transistors 3 in the other memory cells M12, M32 to Mn2 remain at the non-conductive state. This allows the variable resistance element in the memory cell M22 to receive between the two ports the write voltage which is opposite in the polarity to that in the programming action as received from the cell access transistor 3 which is at the conductive state. Simultaneously, the variable resistance element 2 in the memory cell M22 is supplied at the bit line BL2 side or the first port with 2.4 V. The variable resistance element 2 is supplied at the source line SL2 side or the second port with 0 V because the cell access transistor 3 is made of n-channel MOSFET type. Accordingly, the variable resistance element 2 receives the second write voltage of −2.4 V between its two ports. When the duration of applying the second write voltage is set to 20 ns, the variable resistance element 2 in the memory cell M22 shifts to the low resistance state.

The memory cell array shown in FIG. 12 allows the variable resistance element 2 to receive a positive voltage at its first port when a positive voltage is applied from the bit line BL. However, when the positive voltage is applied from the source line SL, it may be declined by the effect of the threshold voltage in the cell access transistor of n-channel MOSFET. Accordingly when being applied via the p-channel MOSFET 8 connected to the common source line SLc, the positive voltage will be declined only once by the effect of the threshold voltage. In case that the positive voltage is supplied via the n-channel MOSFET 7 but not the p-channel MOSFET 8, it passes across the two n-channel MOSFETs and is thus disturbed two times by the threshold voltage before received by the second port of the variable resistance element 2, whereby the current will significantly be interrupted. The inventive device can favorably avoid any interruption in the current.

SIXTH EMBODIMENT

An overall circuitry arrangement of the inventive device including the memory cell array of each of the first to fifth embodiments (as shown in FIGS. 2, 5, 6, 8, and 12) will then be described.

Figure 13:
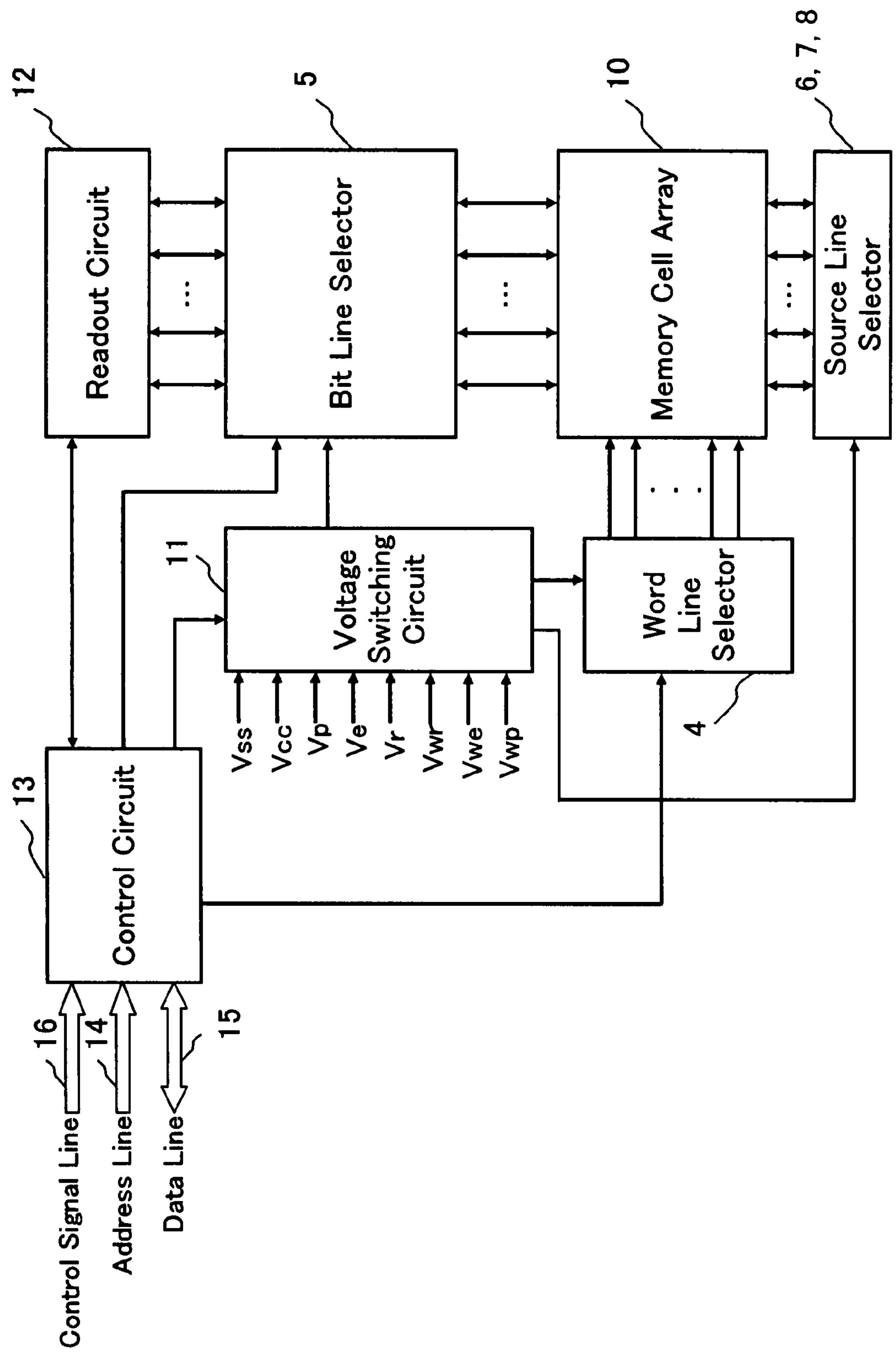
FIG. 13 is a block diagram schematically showing an overall arrangement of the semiconductor memory device according to one of the embodiments of the present invention.
Figure 14:
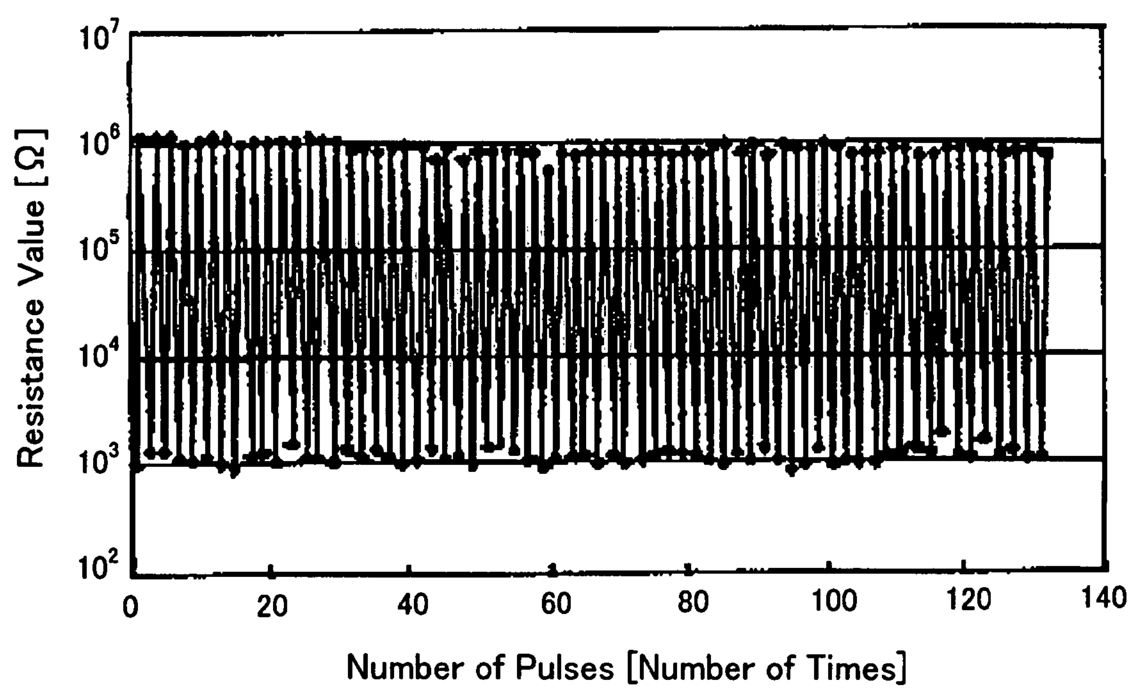
FIG. 14 is a profile of the switching property at the electrical resistance in a variable resistance element made of a PCMO material.

As shown in FIG. 13, the inventive device of this embodiment includes a word line selector 4, a bit line selector 5, a common source line voltage selector 9, a voltage switching circuit 11, a readout circuit 12, and a control circuit 13 which are assembled at the peripheral of the memory cell array 10. The memory cell array 10 comprises an array of the memory cells described in the second to fifth embodiments (as shown in FIGS. 5, 6, 8, and 12). Alternatively, when the memory cell array 10 is identical to that of the first embodiment (See FIG. 2), the common source line voltage selector 9 may be replaced by a source line selector 6.

The word line selector 4 and the bit line selector 5 are arranged for, in response to an address input supplied from an address line 14 and received by the control circuit 13, selecting from the memory cell array 10 the memory cell to be subjected to the reading action, the programming action (the first writing action), and the erasing action (the second writing action). For generally conducting the reading action, the word line selector 4 selects the word line in the memory cell array 10 in response to the inputted signal received from the address line 14 while the bit line selector 5 selects the bit line in the memory cell array 10 in response to the inputted signal received from the address line 14. For starting the programming action, the erasing action, and their related verifying action (the reading action for verifying the memory state in the memory cell after the programming action and the erasing action), the word line selector 4 selects one or more of the word lines in the memory cell array 10 in response to a row address signal determined by the control circuit 13 while the bit line selector 5 selects one or more of the bit lines in the memory cell array 10 in response to a column address signal determined by the control circuit 13. The memory cell connected to the selected word line determined by the word line selector 4 and the selected bit line determined by the bit line selector 5 is then designated as a selected memory cell to be subjected to the desired action.

The control circuit 13 is arranged for controlling the programming action, the erasing action, and the reading action on the memory cell array 10. In response to the address signal from an address line 14, the data input from a data line 15 (during the programming action), and the control input signal from a control signal line 16, the control circuit 13 controls the action of the word line selector 4, the bit line selector 5, the voltage switching circuit 11, and the memory cell array 10 for carrying out the reading action, the programming action, or the erasing action. In the arrangement shown in FIG. 7, the control circuit 13 includes an address buffer circuit, a data input/output buffer circuit, and a control input buffer circuit which are commonly provided as not shown.

The voltage switching circuit 11 is arranged for switching the voltages at the word lines, the bit lines, and the source lines according to the action mode for the reading action, the programming action, or the erasing action on the memory cell array 10 and transferring the same to the memory cell array 10 via the word line selector 4, the bit line selector 5, and the common source line voltage selector 9. More particularly, the voltage to be applied to the word lines is transferred from the voltage switching circuit 11 via the word line selector 4 to the word lines, the voltage to be applied to the bit lines is transferred from the voltage switching circuit 11 via the bit line selector 5 to the bit lines, and the voltage to be applied to the source line is transferred from the voltage switching circuit 11 via the common source line voltage selector 9 to the common source lines. In FIG. 13, Vcc is the source voltage, Vss is the grounding voltage, Vr is the readout voltage, Vp is the voltage for the programming action (the absolute value of the first voltage applied between the two ports of the selected memory cell), Ve is the voltage for the erasing action (the absolute value of the second voltage applied between the two ports of the selected memory cell), Vwr is the selected word line voltage for the reading action, Vwp is the selected word line voltage for the programming action, and Vwe is the selected word line voltage for the erasing action. As described with the first to fifth embodiments, the voltage Vp for the programming action, the voltage Ve for the erasing action, the selected word line voltage Vwp for the programming action, and the selected word line voltage Vwe for the erasing action are set with one predetermined level (2.4 V for example) and can thus be used commonly. Accordingly, the voltage inputs shown in FIG. 13 are common to the voltage switching circuit 11.

The readout circuit 12 is arranged for comparing the readout current flown from the selected bit line determined by the bit line selector 5 via the selected memory cell to the source line directly or after conversion to a voltage form with a reference current or a reference voltage in order to judge the state of stored information (the resistance state) before dispatching a result of the judgment to the control circuit 13 and the data line 15.

The action of reading a memory cell M22 in the memory cell array shown in FIG. 5 will be described. The voltage applying condition for conducting the reading action may be used commonly in another memory cell array.

The reading action starts with the bit line selector 5 setting the bit line BL2 to the readout voltage Vr (1 V for example) while the other bit lines BL1, BL3 to BLm remain at the floating state (under high impedance). Also, the common source line voltage selector 9 is operated to set both the source line selecting leads SSs and SSp to 2.4 V equal to the voltage for the programming action. As the result, the common source line SLc receives 0 V from the n-channel MOSFET 7. Since the source lines SL1 to SLm are connected to the common source line SLc, their voltage is turned to 0 V. This allows the memory cells M12, M22, M32, . . . Mn2 connected between the bit line BL2 and the source line SL2 to receive the readout voltage Vr (1 V for example) between the two ports while the other memory cells remain connected with no voltage.

Moreover, the word line selector 4 is operated to set the word line WL2 to 2.4 V while the other word lines WL1, WL3 to WLn remain at 0 V. As the result, the cell access transistor 3 in the memory cell M22 is turned to the conductive state (turned on) while the cell access transistors 3 in the other memory cells M12, M32 to Mn2 remain at the non-conductive state (turned off). This allows the readout current corresponding to the resistance state of the variable resistance element in the memory cell M22 to flow from the bit line BL2 to the common source line SLc before being received via the bit line selector 5 by the readout circuit 12, whereby the information stored in the memory cell M22 can be read. The voltage applying condition for the reading action may equally be applied to the action of verifying the erasing action or the programming action.

Since the voltage applied to the word line and the source line selecting leads SSs and SSp is shared by the reading action and the programming action, the number of voltage levels to be receive by the voltage switching circuit 11 can be decreased thus contributing to the simplification of the peripheral circuit.

OTHER EMBODIMENTS

Other embodiments of the present invention will then be described.

(1) While the programming action is defined by shifting the resistance state of the variable resistance element from the low resistance state to the high resistance state and the erasing action is defined by shifting the resistance state of the variable resistance element from the high resistance state to the low resistance state in each of the foregoing embodiments, their definition may arbitrarily be determined.

(2) As described with each of the foregoing embodiments, the absolute value of the first write voltage to be applied to the variable resistance element between its two ports for conducting the programming action (by shifting the resistance state from the low resistance state to the high resistance state) is lower than the absolute value of the second write voltage to be applied to the variable resistance element between its two ports for conducting the erasing action (by shifting the resistance state from the high resistance state to the low resistance state). Alternatively, when the absolute value of the first write voltage is not lower than the absolute value of the second write voltage depending on the properties of the variable resistance element to be used, the circuitry arrangement of the inventive device may be applicable with equal success. In the latter case, the voltage applying condition is inverted between the programming action and the erasing action in each of the foregoing embodiments.

(3) While the description of each of the foregoing embodiments is based on the single memory cell array 10 for ease of the understanding, not only one but two or more of the memory cell arrays 10 may be used with equal success.

(4) The first embodiment may be modified for offsetting variations in the resistance of the source lines by the source line selector 6 controlling the voltage applied to the source line selecting leads SSs1 to SSsm and SSp 1 to SSpm thus to determine the voltage applied to the gate of the n-channel MOSFET 7 or the gate of the p-channel MOSFET 8, so that the memory cell array can receive a desired level of the voltage at its source lines SL1 to SLm from the n-channel MOSFT 7 or the p-channel MOSFET 8.

The second to fifth embodiments may also be modified for offsetting variations in the resistance of the source lines by the common source line voltage selector 9 controlling the voltage applied to the common source voltage selecting leads SSs and SSp thus to determine the voltage applied to the gate of the n-channel MOSFET 7 or the gate of the p-channel MOSFET 8, so that the memory cells of a group aligned along one row or column can receive a desired level of the voltage at their common source line SLc from the n-channel MOSFT 7 or the p-channel MOSFET 8.

(5) While the resistance level of the variable resistance element in each of the foregoing embodiments is shifted between the first state (e.g., the low resistance state) and the second state (e.g., the high resistance state) for conducting the programming or erasing action, it may be assigned with three or more different states.

In the latter case, assuming that the first writing action (a programming action) is defined by shifting the resistance level of the variable resistance element from the first state (e.g., the low resistance state) to the second state (e.g., the high resistance state) and the duration of supplying the variable resistance element with the first write voltage between the two ports has a writing duration characteristic where the electrical resistance increases simply with the accumulation of the voltage applying duration, an intermediate resistance state between the first state and the second state can be provided by precisely controlling the duration of applying the variable resistance element with the first write voltage in the programming action. Alternatively, when there is a certain relationship between the first write voltage and the resistance level after shifting the resistance state, an intermediate resistance state between the first state and the second state can be provided by controlling the first write voltage.

The semiconductor memory device according to the present invention is hence applicable to a semiconductor memory device provided with a memory cell which comprises a variable resistance element having two-port structure for, when receiving two different polarity voltages at its two ports, shifting the resistance level from a first state to a second state or vice versa and a cell access transistor connected at the drain to one port of the variable resistance element.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A semiconductor memory device comprising:

an array of memory cells arranged in a row direction and a column direction, each memory cell including a series circuit of a variable resistance element having two-port structure and an electrically openable and closable switch electrically connected at one terminal to one port of the variable resistance element, each switch in the memory cells aligned along one row being connected at a control terminal to a common word line extending in the row direction, one port other than the control terminal of the memory cells aligned along one column being connected to a common bit line extending in the column direction, and the other port other than the control terminal of the memory cell being connected to a source line extending in the row or column direction; and a voltage supplying means for conducting a first writing action for shifting an electrical resistance from a first state to a second state by applying a first voltage between the bit line and the source line connected to a selected memory cell to be written in the memory cell array and a third voltage to the word line connected to the control terminal of the switch in the selected memory cell thus to apply a first write voltage between the two ports of the variable resistance element in the selected memory cell, and for conducting a second writing action for shifting the electrical resistance from the second state to the first state by applying a second voltage, which is opposite in the polarity to the first voltage, between the bit line and the source line connected to the selected memory cell, and the third voltage to the word line connected to the control terminal of the switch in the selected memory cell thus to apply a second write voltage between the two ports of the variable resistance element in the selected memory cell, the second write voltage being opposite in the polarity to and different in the absolute value from the first write voltage, wherein the variable resistance element is a nonvolatile memory element capable of storing information so that the information can be electrically written by shifting the electrical resistance between the first state and the second state when the first write voltage and the second write voltage are applied to the two ports respectively, the switch is an element that shifts conductivity from a conductive state to a non-conductive state or vice versa between the first terminal and the second terminal according to a voltage applied to the control terminal, and the voltage supplying means comprises an n-channel enhancement type MOSFET and a p-channel enhancement type MOSFET as drive elements for driving the source line.

2. The semiconductor memory device according to claim 1, wherein:

the memory cell includes a series circuit of a variable resistance element having two-port structure and an electrically openable and closable switch electrically connected at a first terminal to a second port of the variable resistance element, each variable resistance element in the memory cells aligned along one column is connected at a first port to a common bit line extending in the column direction, and the switch in the memory cell is connected at a second terminal to a source line extending in the row or column direction.

3. The semiconductor memory device according to claim 2, wherein the switch is a cell access transistor comprising an enhancement type n-channel MOSFET, and the first terminal, the second terminal, and the control terminal of the switch are a drain, a source, and a gate of the cell access transistor, respectively.

4. The semiconductor memory device according to claim 2, further comprising:

a readout circuit for detecting a current flowing along the bit line connected to the selected memory cell to be read out in the memory cell array and reading a memory state from the selected memory cell, wherein in a reading action for reading the memory state from the selected memory cell, the voltage supplying means applies a fourth voltage between the bit line and the source line connected to the selected memory cell and then a fifth voltage to the word line connected to the control terminal of the switch in the selected memory cell for changing the switch into the conductive state, and the readout circuit detects a memory cell current which flows from the bit line to the source line connected to the selected memory cell though the variable resistance element and the switch in the selected memory cell according to the electrical resistance of the variable resistance element thus to read the memory state from the memory cell.

5. The semiconductor memory device according to claim 4, wherein the fifth voltage and the third voltage are identical to each other.

6. The semiconductor memory device according to claim 2, wherein the voltage supplying means uses the n-channel MOSFET or the p-channel MOSFET as the drive element by switching them between on and off according to whether it is in the first writing action or the second writing action.

7. The semiconductor memory device according to claim 2, wherein the first voltage and the second voltage are equal to each other in the absolute value.

8. The semiconductor memory device according to claim 2, wherein a potential at a high voltage side applied between the bit line and the source line connected to the selected memory cell is equal to a potential at the word line connected to the selected memory cell in at least either the first write action or the second write action.

9. The semiconductor memory device according to claim 2, wherein a potential at the word line connected to the selected memory cell is higher than a potential at a high voltage side applied between the bit line and the source line connected to the selected memory cell in at least either the first writing action or the second writing action.

10. The semiconductor memory device according to claim 2, wherein a potential at the low voltage side applied between the bit line and the source line connected to the selected memory cell is equal to a grounding potential in at least either the first writing action or the second writing action.

11. The semiconductor memory device according to claim 2, wherein a potential at a high voltage side applied between the bit line and the source line connected to the selected memory cell is equal between the first writing action and the second writing action.

12. The semiconductor memory device according to claim 2, wherein the first and second states of the electrical resistance in the variable resistance element are two of three or more resistance states which correspond to memory states of the variable resistance element, and an action of shifting the resistance state to other state than the first and second states is carried out by controlling a voltage level or an application time of the first voltage in the first writing action or the second voltage in the second writing action.

13. The semiconductor memory device according to claim 2, wherein the variable resistance element comprises a variable resistor which contains titanium nitride, titanium oxide, or titanium oxynitride.

14. The semiconductor memory device according to claim 2, wherein the variable resistance element comprises a variable resistor which contains a manganese-containing oxide having perovskite structure expressed by $Pr_{(1-x)}Ca_xMnO_3$ (where $0<x<1$).

15. The semiconductor memory device according to claim 1, wherein:

the memory cell includes a series circuit of a variable resistance element having two-port structure and an electrically openable and closable switch electrically connected at a second terminal to a second port of the variable resistance element, each switch in the memory cells aligned along one column is connected at a first port to a common bit line extending in the column direction, and the variable resistance element in the memory cell is connected at a first terminal to a source line extending in the row or column direction.

16. The semiconductor memory device according to claim 15, wherein the switch is a cell access transistor comprising an enhancement type n-channel MOSFET, and the first terminal, the second terminal, and the control terminal of the switch are a drain, a source, and a gate of the cell access transistor, respectively.

17. The semiconductor memory device according to claim 15, further comprising:

a readout circuit for detecting a current flowing along the bit line connected to the selected memory cell to be read out in the memory cell array and reading a memory state from the selected memory cell, wherein in a reading action for reading the memory state from the selected memory cell, the voltage supplying means applies a fourth voltage between the bit line and the source line connected to the selected memory cell and then a fifth voltage to the word line connected to the control terminal of the switch in the selected memory cell for changing the switch into the conductive state, and the readout circuit detects a memory cell current which flows from the bit line to the source line connected to the selected memory cell though the variable resistance element and the switch in the selected memory cell according to the electrical resistance of the variable resistance element thus to read the memory state from the memory cell.

18. The semiconductor memory device according to claim 17, wherein the fifth voltage and the third voltage are identical to each other.

19. The semiconductor memory device according to claim 15, wherein the voltage supplying means uses the n-channel MOSFET or the p-channel MOSFET as the drive element by switching them between on and off according to whether it is in the first writing action or the second writing action.

20. The semiconductor memory device according to claim 15, wherein the first voltage and the second voltage are equal to each other in the absolute value.

21. The semiconductor memory device according to claim 15, wherein a potential at a high voltage side applied between the bit line and the source line connected to the selected memory cell is equal to a potential at the word line connected to the selected memory cell in at least either the first write action or the second write action.

22. The semiconductor memory device according to claim 15, wherein a potential at the word line connected to the selected memory cell is higher than a potential at a high voltage side applied between the bit line and the source line connected to the selected memory cell in at least either the first writing action or the second writing action.

23. The semiconductor memory device according to claim 15, wherein a potential at the low voltage side applied between the bit line and the source line connected to the selected memory cell is equal to a grounding potential in at least either the first writing action or the second writing action.

24. The semiconductor memory device according to claim 15, wherein a potential at a high voltage side applied between the bit line and the source line connected to the selected memory cell is equal between the first writing action and the second writing action.

25. The semiconductor memory device according to claim 15, wherein the first and second states of the electrical resistance in the variable resistance element are two of three or more resistance states which correspond to memory states of the variable resistance element, and an action of shifting the resistance state to other state than the first and second states is carried out by controlling a voltage level or an application time of the first voltage in the first writing action or the second voltage in the second writing action.

26. The semiconductor memory device according to claim 15, wherein the variable resistance element comprises a variable resistor which contains titanium nitride, titanium oxide, or titanium oxynitride.

27. The semiconductor memory device according to claim 15, wherein the variable resistance element comprises a variable resistor which contains a manganese-containing oxide having perovskite structure expressed by $Pr_{(1-x)}Ca_XMnO_3$ (where $0<x<1$).

* * * * *